(12) United States Patent
Yamaguchi

(10) Patent No.: US 11,290,067 B2
(45) Date of Patent: Mar. 29, 2022

(54) RADIO FREQUENCY CIRCUIT

(71) Applicants: KABUSHIKI KAISHA TOSHIBA, Minato-ku (JP); TOSHIBA INFRASTRUCTURE SYSTEMS & SOLUTIONS CORPORATION, Kawasaki (JP)

(72) Inventor: Keiichi Yamaguchi, Kawasaki (JP)

(73) Assignees: KABUSHIKI KAISHA TOSHIBA, Minato-ku (JP); TOSHIBA INFRASTRUCTURE SYSTEMS & SOLUTIONS CORPORATION, Kawasaki (JP)

( * ) Notice: Subject to any disclaimer, the term of this patent is extended or adjusted under 35 U.S.C. 154(b) by 124 days.

(21) Appl. No.: 16/817,837

(22) Filed: Mar. 13, 2020

(65) Prior Publication Data
US 2020/0295716 A1     Sep. 17, 2020

(30) Foreign Application Priority Data
Mar. 15, 2019   (JP) .............................. JP2019-049096

(51) Int. Cl.
| | | |
|---|---|---|
| H03F 3/191 | (2006.01) | |
| H03F 3/193 | (2006.01) | |
| H03F 1/32 | (2006.01) | |
| H03F 3/60 | (2006.01) | |
| H03F 1/02 | (2006.01) | |

(52) U.S. Cl.
CPC ........... *H03F 3/193* (2013.01); *H03F 1/0205* (2013.01); *H03F 1/3205* (2013.01); *H03F 3/601* (2013.01); *H03F 2200/12* (2013.01); *H03F 2200/267* (2013.01)

(58) Field of Classification Search
CPC .......... H03F 1/0211; H03F 1/56; H03F 3/191; H03F 3/193
USPC ........................................ 330/297, 302, 306
See application file for complete search history.

(56) References Cited

U.S. PATENT DOCUMENTS

| | | | | |
|---|---|---|---|---|
| 7,084,708 B2 * | 8/2006 | Sugiura | ............. | H01L 23/49838 330/302 |
| 7,423,490 B2 * | 9/2008 | Ma | ......................... | H03H 7/075 330/297 |
| 9,543,898 B2 | 1/2017 | Tsuyama et al. | | |

FOREIGN PATENT DOCUMENTS

JP          6112500 B2    4/2017

\* cited by examiner

*Primary Examiner* — Steven J Mottola
(74) *Attorney, Agent, or Firm* — Oblon, McClelland, Maier & Neustadt, L.L.P.

(57) ABSTRACT

A radio frequency circuit has an amplifier that amplifies an input radio frequency signal, a power supply path that is disposed between an output node of the amplifier and a power supply node to which a DC bias voltage is supplied, and includes a first inductor and a second inductor connected in series, a first resonator that comprises a third inductor and a first capacitor connected in series to the third inductor, and resonates at a series resonance frequency, a second resonator that resonates at a series resonance frequency corresponding to an inductance of the first inductor, a capacitance of the second capacitor, and a resistance value of the first resistor, and a third resonator that comprises a third capacitor connected in parallel with the second inductor, and resonates at a parallel resonance frequency corresponding to a capacitance of the third capacitor and an inductance of the second inductor.

16 Claims, 42 Drawing Sheets

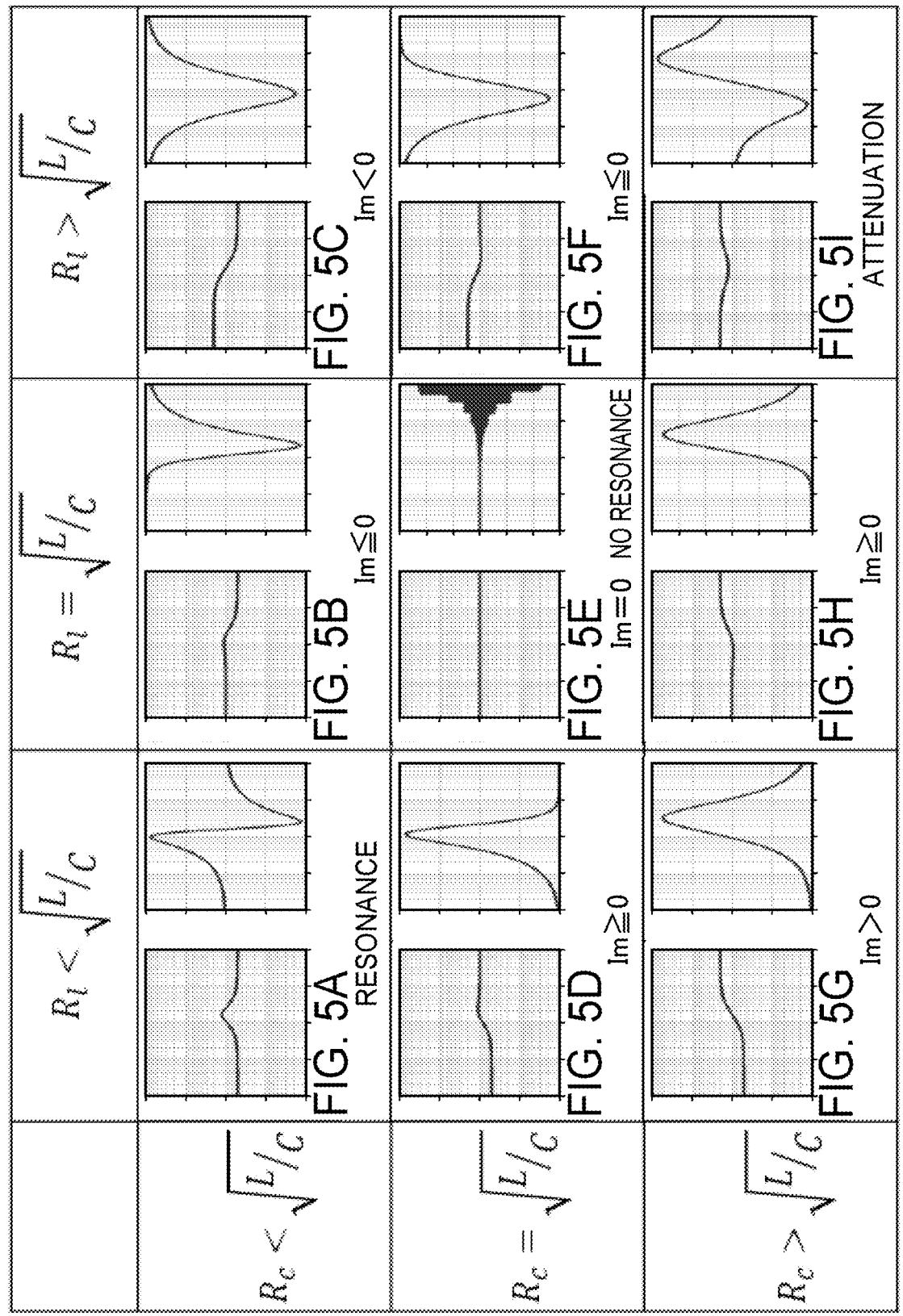

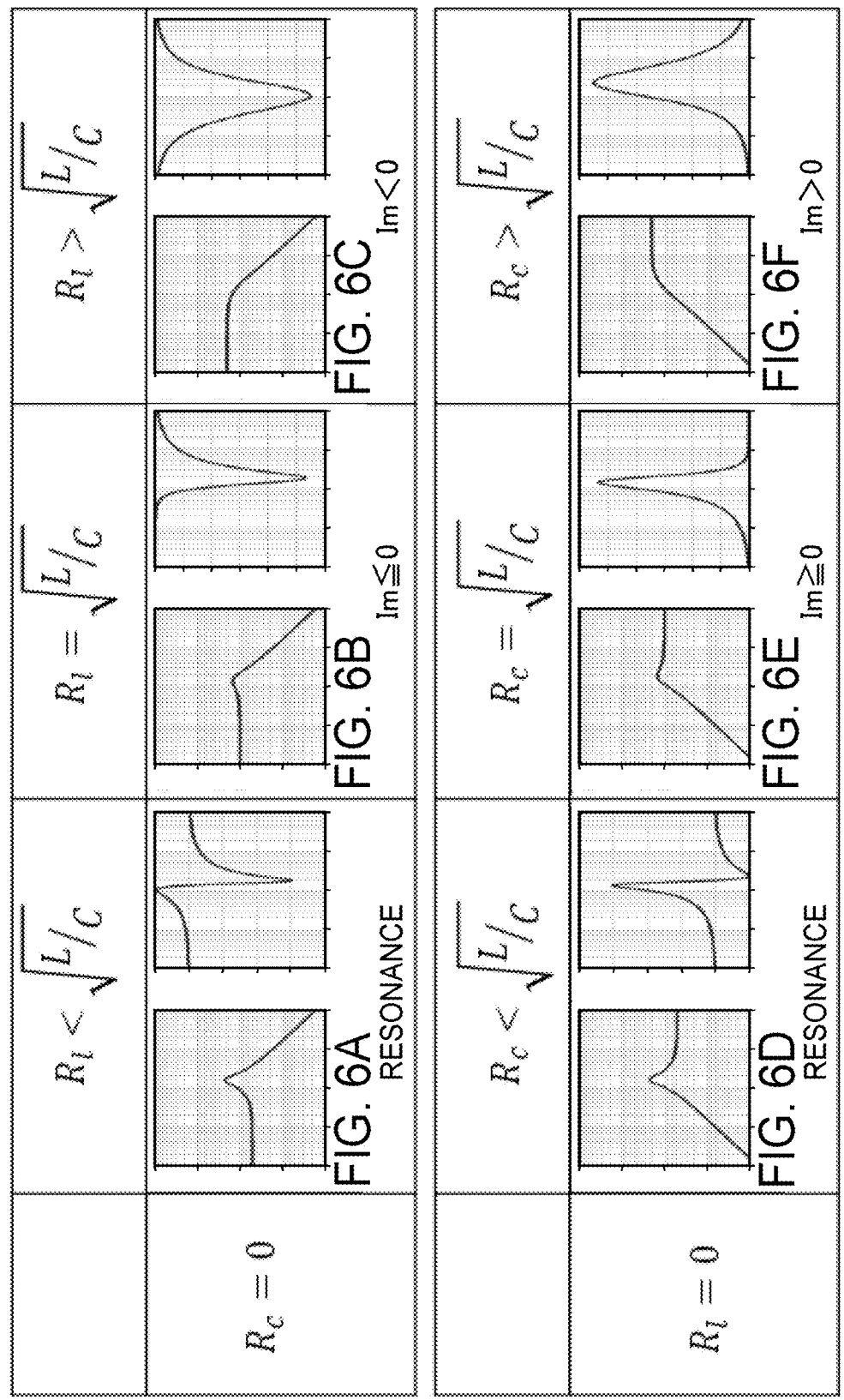

| Rc | EQUATION(6) | SIMULATION |
|---|---|---|
| 0.1 Ω | 0.100 | 0.147@18.60kHz |
| 0.05 Ω | 0.200@18.378kHz | 0.224@16.12kHz |
| 0.02 Ω | 0.500@16.244kHz | 0.510@15.92kHz |
| 0.01 Ω | 1000@15.996kHz | 1.005@15.91kHz |

FIG. 8

| $f_{RF}$ | $L_{\lambda/4}$ |
|---|---|
| 100MHz | 125nH |
| 200MHz | 62.5nH |
| 500MHz | 25.0nH |
| 1GHz | 12.5nH |
| 2GHz | 6.25nH |
| 5GHz | 2.50nH |
| 10GHz | 1.25nH |
| 20GHz | 0.625nH |
| 50GHz | 0.250nH |

FIG.16

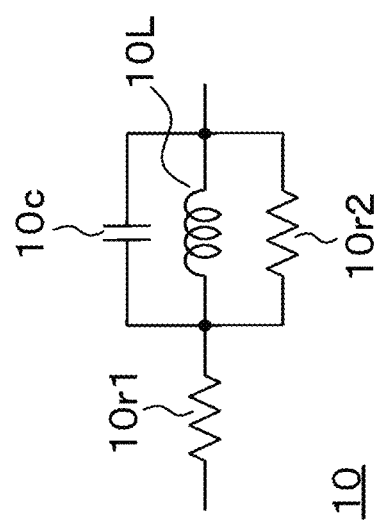

RADIO FREQUENCY CIRCUIT

CROSS REFERENCE TO RELATED APPLICATIONS

This application is based upon and claims the benefit of priority from the prior Japanese Patent Application No. 2019-49096, filed on Mar. 15, 2019, the entire contents of which are incorporated herein by reference.

FIELD

Embodiments described herein relate generally to a radio frequency circuit.

BACKGROUND

In a radio frequency transistor circuit of the related art, a λ/4 transmission line for obtaining a high impedance at a radio frequency signal of 10 MHz to 10 GHz in a frequency band is used for a bias circuit such that a power supply path for applying a bias does not affect the radio frequency signal.

In the radio frequency circuit including a transistor that amplifies the radio frequency signal, it is desirable that an impedance at the radio frequency signal in a baseband is lowered as much as possible in order to reduce signal distortion. However, when the λ/4 transmission line is used as the power supply path as described above, since the impedance at several tens of MHz to several hundreds of MHz which is the baseband cannot be lowered, there is a problem that the baseband is limited to about 1/100 or less of the frequency of the radio frequency signal.

BRIEF DESCRIPTION OF THE DRAWINGS

FIGS. 5A to 5I are characteristic diagrams of absolute values and reactance components of Zbias impedances of the parallel resonance circuit of FIG. 3;

FIGS. 6A to 6F are characteristic diagrams of the absolute values and the reactance components of the Zbias impedances subsequent to FIG. 5;

FIG. 8 is a diagram illustrating Zmax and a value of a parallel resonance frequency obtained by Equation (2), (6) and a simulation;

FIG. 16 is a diagram illustrating a correspondence between $f_{RF}$ and $L_{\lambda/4}$;

FIG. 35A is a simple equivalent circuit diagram of a ferrite bead;

DETAILED DESCRIPTION

Figure 1:
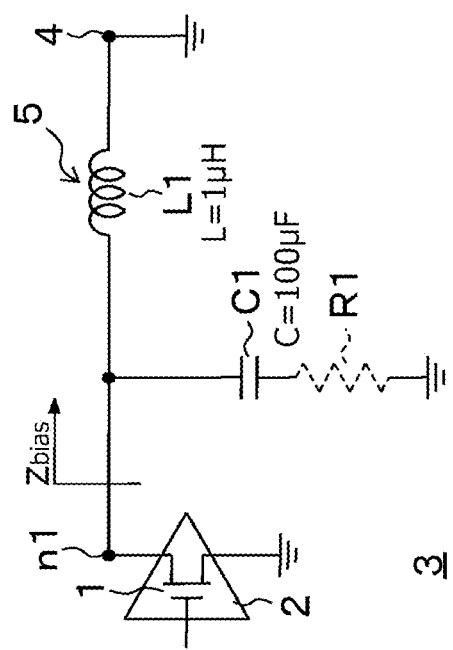
FIG. 1 is an equivalent circuit diagram of a radio frequency circuit with amplification including a transistor.

According to one embodiment, a radio frequency circuit has:

an amplifier that amplifies an input radio frequency signal;

a power supply path that is disposed between an output node of the amplifier and a power supply node to which a DC bias voltage is supplied, and includes a first inductor and a second inductor connected in series;

a first resonator that includes a third inductor and a first capacitor connected in series to the third inductor, at least a part of the third inductor being connected between the output node of the amplifier and the power supply path, and resonates at a series resonance frequency corresponding to an inductance of the third inductor and a capacitance of the first capacitor;

a second resonator that includes a second capacitor connected to a connection node between the first inductor and the second inductor, and a first resistor connected in series to the second capacitor, and that resonates at a series resonance frequency corresponding to an inductance of the first inductor, a capacitance of the second capacitor, and a resistance value of the first resistor; and a third resonator that includes a third capacitor connected in parallel with the second inductor, and resonates at a parallel resonance frequency corresponding to a capacitance of the third capacitor and an inductance of the second inductor.

Hereinafter, an embodiment of the present disclosure will be described with reference to the drawings. In the drawings attached to the present specification, the scales and the vertical and horizontal dimension ratios are appropriately changed and exaggerated from the actual scales and ratios for the sake of illustration and easy understanding.

FIG. 1 is a baseband equivalent circuit diagram of a radio frequency circuit 3 with amplification including a transistor 1. The frequency circuit 3 may have an amplifier 2 including the transistor 1. Accordingly, in the following description, circuits or power supplies for matching for extracting radio frequency signals, power combining, or transmitting are converted into equivalent circuits representing impedances of these circuits in a baseband. Capacitors, inductors, distributed constant elements, transmission lines, and power supplies having impedances capable of being ignored in the baseband are handled as short circuits or open circuits, and are omitted. The radio frequency circuit 3 in FIG. 1 includes a power supply path 5 connected between an output node n1 of the amplifier 2 and a power supply node 4 of a low-impedance power supply (equivalent to a short circuit), and a capacitor C1 and a resistor R1 connected in series between the output node n1 of the amplifier 2 and a ground node which is a reference potential of the circuit. The capacitor C1 is also called a decoupling capacitor or a bypass capacitor. Here, the amplifier 2 means a various type of circuitry that conduct amplification, oscillation, multiplication, or frequency division etc. by using amplification of the transistor.

First, in an equivalent circuit in which the resistor R1 is omitted from FIG. 1, it is considered that an impedance Zbias on a side of the power supply node 4 from the output node n1 of the amplifier 2 is lowered in a wideband in the baseband. In this case, it is necessary to design a parallel resonance circuit formed by an inductor L1 and the capacitor C1 in the wiring such as the power supply path 5 so as not to cause anti-resonance.

In the circuit of FIG. 1, since a decoupling capacitor and a power supply impedance at the next stage can be regarded as equivalently zero, the power supply node 4 is equivalent to ground in terms of AC. Since a power supply connected to the power supply node 4 usually has feedback for regulation, the simplest model can be expressed by a series equivalent circuit of L and R including an output resistor. In the present equivalent circuit, since the L and R components of the power supply are small, the L and R components can be ignored.

Even though the inductance of the power supply impedance of the DC power source is not negligible with respect to a power cable, since this inductance is connected in series, this inductance can be included in the inductor L1 of FIG. 1. In this case, a significant decoupling capacitor seen from a DC power supply is C1.

A reactance component $X_0$ at a resonance angler frequency $\varphi 0$ of the parallel resonance circuit formed by the inductor L1 and the capacitor C1 of FIG. 1 is expressed by the following Equation (1). In Equation (1), the inductance of the inductor L1 is L, and the capacitance of the capacitor C1 is C.

$$\omega_0 L = \frac{1}{\omega_0 C} = X_0 \qquad (1)$$

Figure 2:
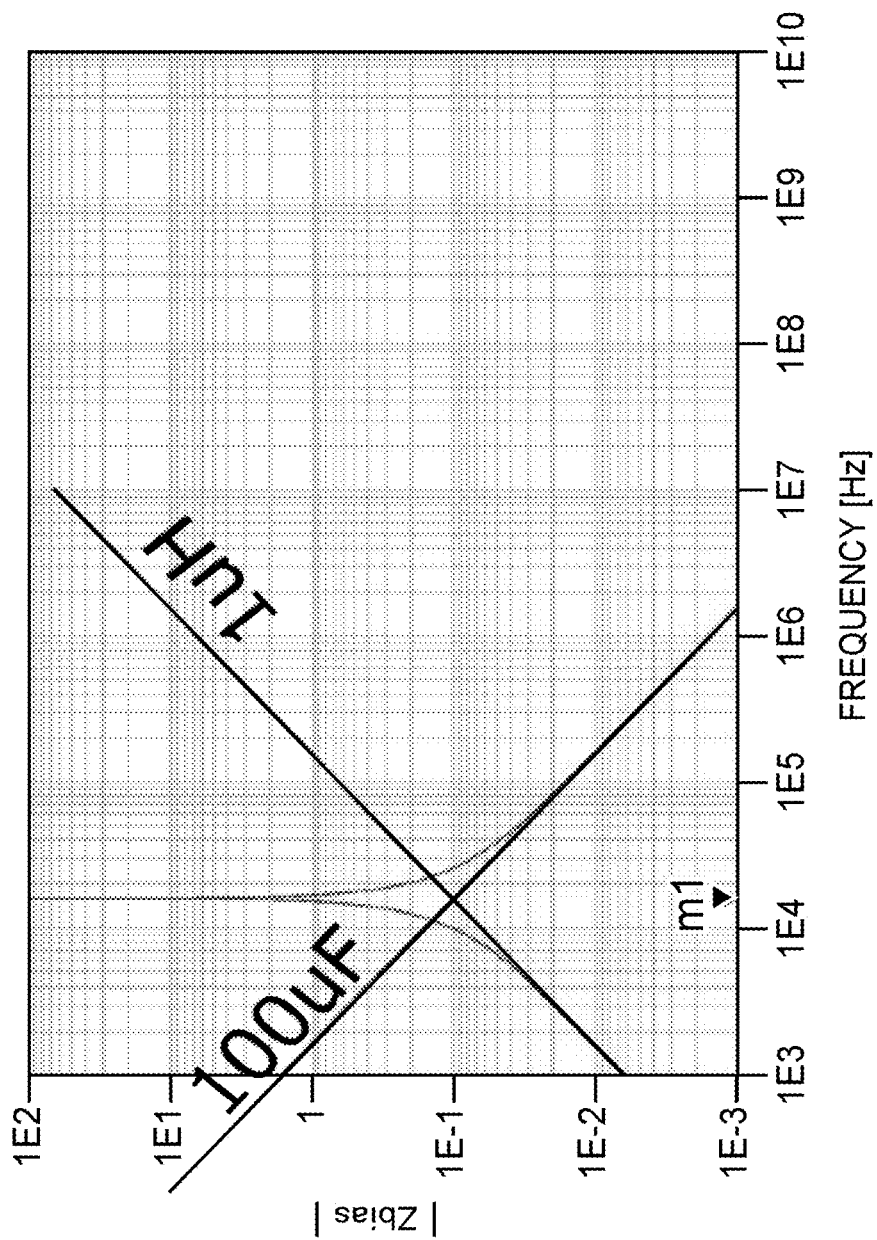
FIG. 2 is a characteristic diagram illustrating an impedance of an inductor, a capacitor, and an anti-resonance of FIG. 1.

FIG. 2 is a characteristic diagram illustrating impedances of the inductor L1, the capacitor C1, and the parallel resonance circuit of the inductor L1 and the capacitor C1 of FIG. 1. A horizontal axis of FIG. 2 is a frequency [Hz], and a vertical axis is an absolute value of the impedance. As illustrated in FIG. 2, the impedance of the inductor L1 linearly increases as the frequency increases, and the impedance of the capacitor C1 linearly decreases as the frequency increases. The impedance at an intersection of a straight line of the inductor L1 and a straight line of the capacitor C1 (a value on the vertical axis at the intersection of FIG. 2) is the impedance (reactance) $X_0$ at a parallel resonance frequency. For example, when C1=100 μF and L1=1 nH, $X_0$=0.1Ω. A peak of an anti-resonance appears at frequency of the intersection. The impedance at this frequency is theoretically infinite. When an impedance of a bias circuit necessary for suppressing distortion of the amplifier 2 is 1Ω, a baseband of a signal that can be handled by this radio frequency circuit is about 15 KHz from FIG. 2.

Figure 3:
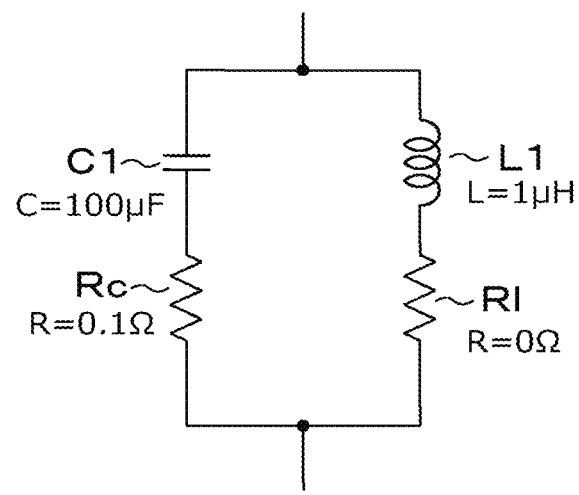
FIG. 3 is a generalized circuit diagram of a parallel resonance circuit of a capacitor and an inductor.

Next, it is considered that the peak of the anti-resonance is suppressed by giving a loss to the circuit of FIG. 1. Specifically, the parallel resonance circuit of the capacitor C1 and the inductor L1 is generalized, and a case where the capacitance C of the capacitor C1 and the inductance L of the inductor L1 have resistor components Rc and Rl, respectively, is considered as illustrated in FIG. 3. A frequency f at which an imaginary part of the parallel resonance circuit of FIG. 3 is zero is expressed by the following Equation (2).

$$f = \frac{1}{2\pi\sqrt{LC}}\sqrt{\frac{CR_l^2 - L}{CR_c^2 - L}} \quad (2)$$

That is, when a value in a square root on a right side of Equation (2) is not a positive number, the reactance is not inversed to positive or negative in the circuit of FIG. 3. However, a peak is still present at an absolute value of the reactance.

Figure 4A:
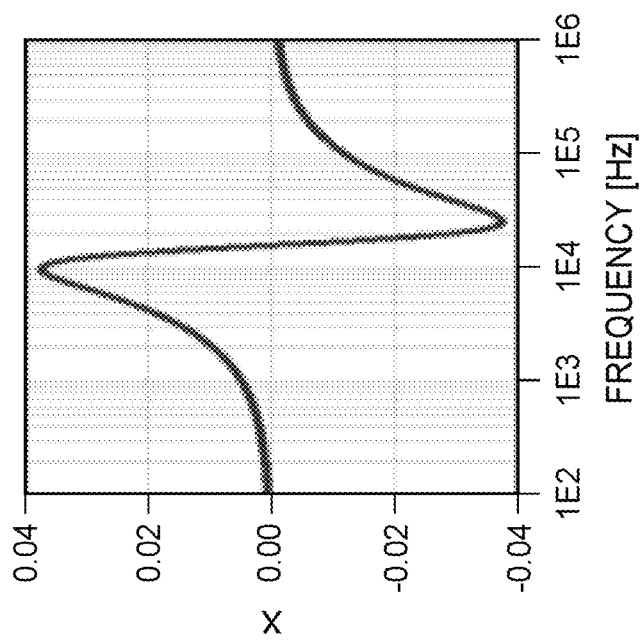
FIG. 4A is a characteristic diagram illustrating frequency dependence of an absolute value of an impedance of the parallel resonance circuit of FIG. 3.
Figure 4B:
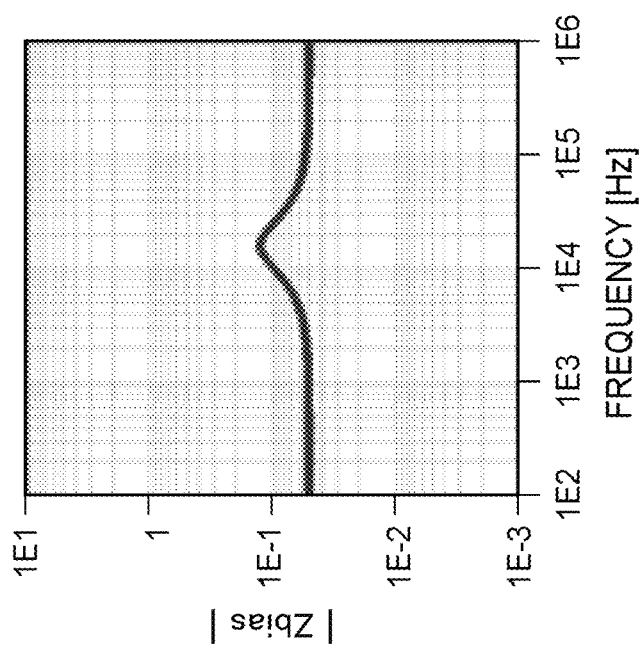
FIG. 4B is a characteristic chart illustrating frequency dependence of a reactance component.

FIG. 4A is a characteristic diagram illustrating frequency dependence of an absolute value |Zbias| of the impedance of the parallel resonance circuit of FIG. 3 when C=100 µF, L=1 µH, √(L/C)=$X_0$=0.1, Rc=0.05Ω, and Rl=0.05Ω, and FIG. 4B is a characteristic diagram illustrating frequency dependence of a reactance component X. A horizontal axis in these characteristic diagrams is a frequency [Hz]. A vertical axis of a characteristic in FIG. 4A is the absolute value |Zbias|, and a vertical axis of a characteristic of FIG. 4B is the reactance component X. Characteristics of FIGS. 4A and 4B are obtained through simulations.

As can be seen from the characteristic diagram of FIG. 4A, the absolute value |Zbias| of the output impedance is not greater than 0.2. √(L/C)=Rc=Rl, and thus, |Zbias|=$X_0$ and X=0. The impedance is constant regardless of the frequency, and resonance does not occur. When a loss is given to only one of Rc and Rl, a resistance value obtained by multiplying $X_0$ by a value greater than a threshold present between 1.5537 and 1.5538 is used, and thus, resonance does not occur. In practice, a peak of the resonance caused in the impedance considerably flat by selecting a value obtained by multiplying $X_0$ by √2 such that Q=1/√2 as in the case of 2nd order filter, and thus, the impedance can be almost $X_0$. Even though $X_0$=1, there is no problem in practical use, but the resonance peak is slightly seen. Accordingly, a margin of 1 or 2 is useful. In the present disclosure, a phenomenon that the peak appears at the absolute value of the impedance is defined as the "resonance". This is different from the fact that the zero reactance is defined as resonance for convenience in electrical engineering.

Here, it is assumed that the resistors Rc and Rl when the value in the square root on the right side of Equation (2) is a positive number or not a positive number are expressed by the following Equations (3) to (5).

$$R_C, R_l = 0.05 < \sqrt{\frac{L}{C}} \quad (3)$$

$$R_C, R_l = 0.1 = \sqrt{\frac{L}{C}} \quad (4)$$

$$R_C, R_l = 0.2 > \sqrt{\frac{L}{C}} \quad (5)$$

Figure 7:
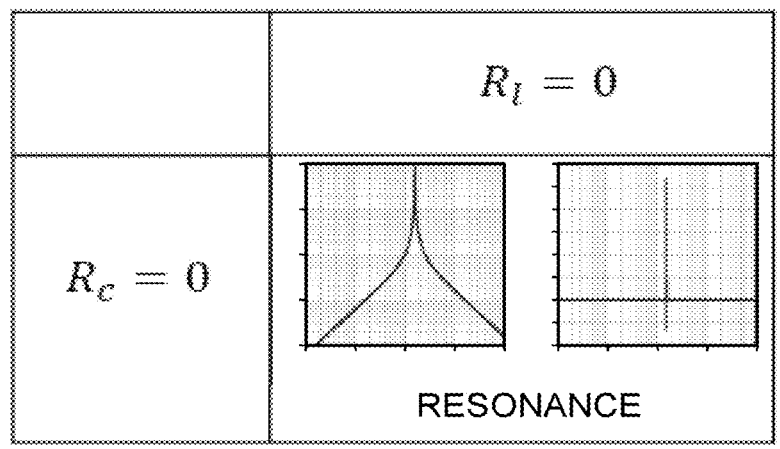
FIG. 7 is a characteristic diagram of the absolute value of the output impedance and the reactance component subsequent to FIG. 6.

Characteristics of the absolute value of the output impedance and the reactance component of the parallel resonance circuit of FIG. 3 in any combination of the resistors Rc and Rl expressed by Equations (3) to (5) are expressed in FIGS. 5 to 7. FIGS. 5 to 7 show simulation results.

A left characteristic diagram in each combination of the resistors Rc and Rl in FIGS. 5 to 7 represents the frequency dependence of the absolute value |Zbias| of the output impedance, and a right characteristic represents the frequency dependence of the reactance component X.

In each combination of the resistors Rc and Rl illustrated in FIGS. 5A, 6A, 6D, and 7, since the characteristic of the reactance component X changes from positive to negative, the resonance may occur. For example, when both the resistors Rc and Rl are smaller than √(L/C), expressed by Equation (3), the parallel resonance circuit of FIG. 3 resonates as illustrated in FIG. 5A, and the peak value at the anti-resonance frequency also increases. Meanwhile, when both the resistors Rc and Rl are larger than √(L/C), expressed by Equation (5), the parallel resonance circuit of FIG. 3 resonates as illustrated in the characteristic of FIG. 5I, but since the absolute value of the output impedance is low at the resonance point, the peak of the anti-resonance is suppressed.

A maximum impedance value Zmax at a frequency at which the reactance of the parallel resonance circuit of FIG. 3 is zero is expressed by the following Equation (6).

$$Z_{max} = \frac{R_c R_l}{R_c + R_l} + \frac{1}{R_c + R_l}\frac{L}{C} \quad (6)$$

Here, when C=100 µF and L=1 µH, L/C=0.01. In a condition in which resonance occurs when a loss is given to only the capacitor C, the resistor Rl=0, and Rc<0.1, for example, Zmax=0.2 when Rc=0.05, and the parallel resonance frequency at this time is 18.378 kHz. Meanwhile, in the simulation, Zmax=0.224, and the parallel resonance frequency is 16.12 kHz.

As the resistor Rc becomes smaller, an error between Zmax calculated by Equation (6) and the value obtained through the simulation becomes smaller. FIG. 8 is a diagram illustrating the Zmax and the value of the parallel resonance frequency obtained from Equation (6) and the simulation at various resistance values of the resistor Rc.

It can be seen that instead of a case where R<√(L/C) at which sharp resonance occurs, a case where R=√(L/C) or a case where R>√(L/C) is appropriate in the parallel resonance circuit of FIG. 3 in order to suppress the impedance at the anti-resonance near the target $X_0$. However, in even a case where R<√(L/C), since the resonance peak can be predicted as illustrated in FIG. 5A, the resistance value of the resistor Rc or Rl is adjusted, and thus, the peak of the anti-resonance can be suppressed to a desired value.

In order to suppress the impedance Zbias in the circuit of FIG. 1 to approximately the desired value $X_0$, the following Equation (7) may be satisfied.

$$X_0 > \sqrt{\frac{L}{C}} \quad (7)$$

Equation (7) indicates that a condition in which L<$X_0^2$C or C>L/$X_0^2$ needs to be satisfied. For example, when it is desired to suppress $X_0$ to about 0.1, in a case where L=1 µH, C>100 µF, and a target loss to be given to the circuit at this time is also $X_0$. When C decreases to 50 µF, the impedance increases to $X_0$=0.14. In contrast, even though a wiring of 2 µH is connected to C of 100 µF, the impedance increases to $X_0$=0.14.

Figure 9:
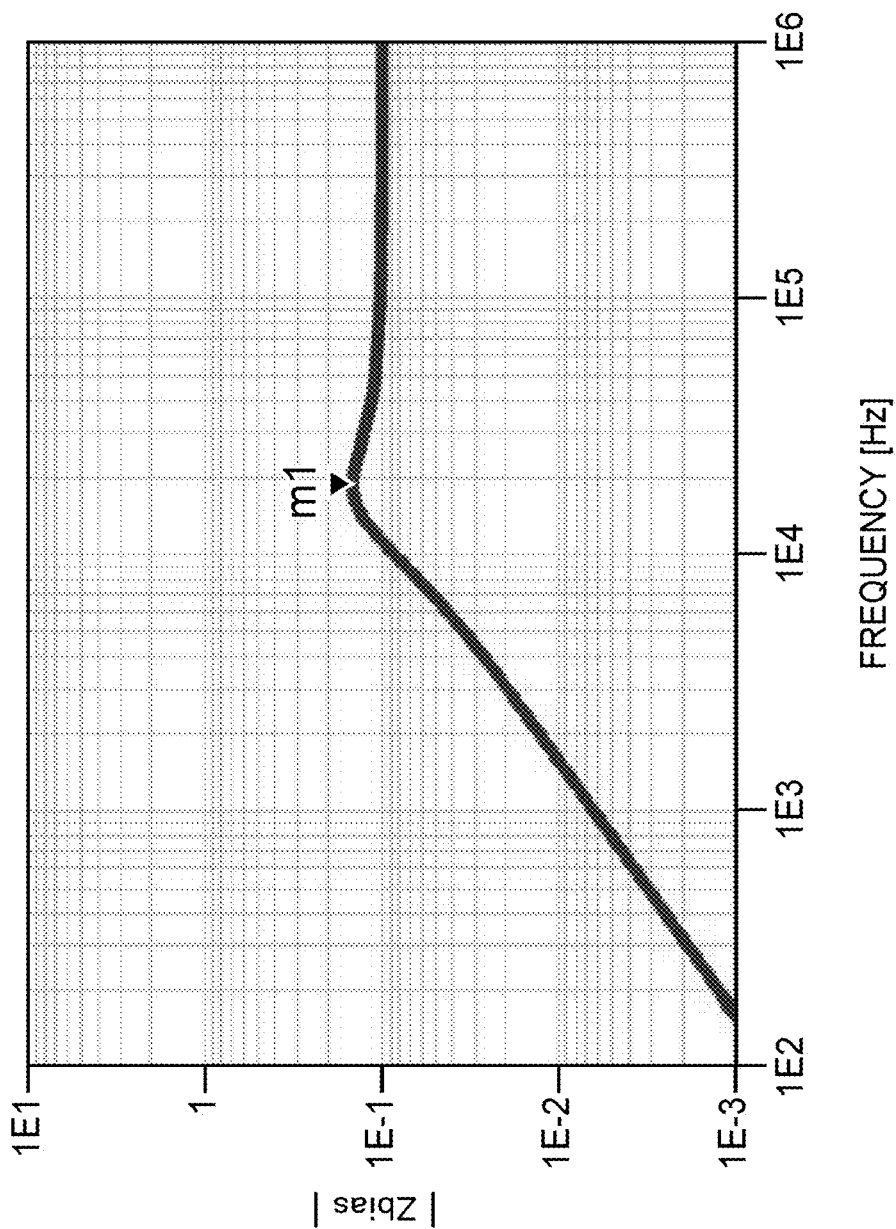
FIG. 9 is a characteristic diagram illustrating the frequency dependence of the absolute value of the Zbias impedance.

FIG. 9 is a characteristic diagram illustrating the frequency dependence of the absolute value of the impedance Zbias when the capacitor C1 which is the decoupling capacitor=100 µF, the inductor L1=1 µH, √(L/C)=0.1, and R1=0.1Ω in the circuit of FIG. 1, and represents the simulation result. In the case of FIG. 9, the peak value of the impedance Zbias is about 1.4.

In the actual radio frequency circuit 3, it is difficult to dispose a decoupling capacitor having a sufficiently large capacitance in the vicinity of the transistor 1 within the amplifier 2 due to restrictions on component dimensions. For example, the capacitor of 100 µF has a large 10φ×20 mm in a rated voltage of 100V, the component itself has an effective series inductance (ESL) of 5 nH or more, and a terminal lead also has a parasitic inductance of several nH. To improve signal distortion, gain and power consumption a power supply voltage of the high-power amplifier 2 tends to increase, and it is difficult to achieve an increase in band width of a modulation signal and an increase in parasitic inductance due to an increase in size of the component due to increase in rated voltage of capacitor in recent years. Thus, there is a problem in designing the bias circuit.

Figure 10:
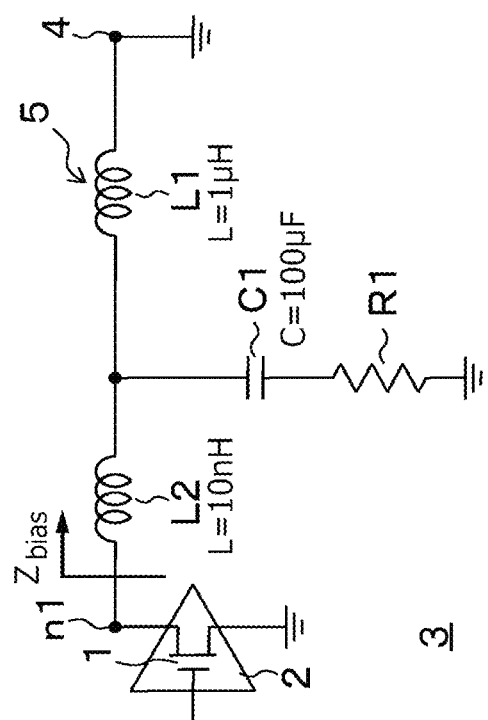
FIG. 10 is a possible equivalent circuit diagram of the circuit of FIG. 1.

When it is assumed that decoupling capacitor C1 of 100 uF connected to the output node n1 of the amplifier 2 in the circuit of FIG. 1 has a parasitic inductance ESL of the lead and track of 10 nH, a possible equivalent circuit as illustrated in FIG. 10 is obtained. In the circuit of FIG. 10, an inductor L2 is connected between the output node n1 of the amplifier 2 and the power supply path 5. An upper limit of the baseband frequency band width of the bias circuit is limited by the reactance of the inductor L2.

Figure 11:
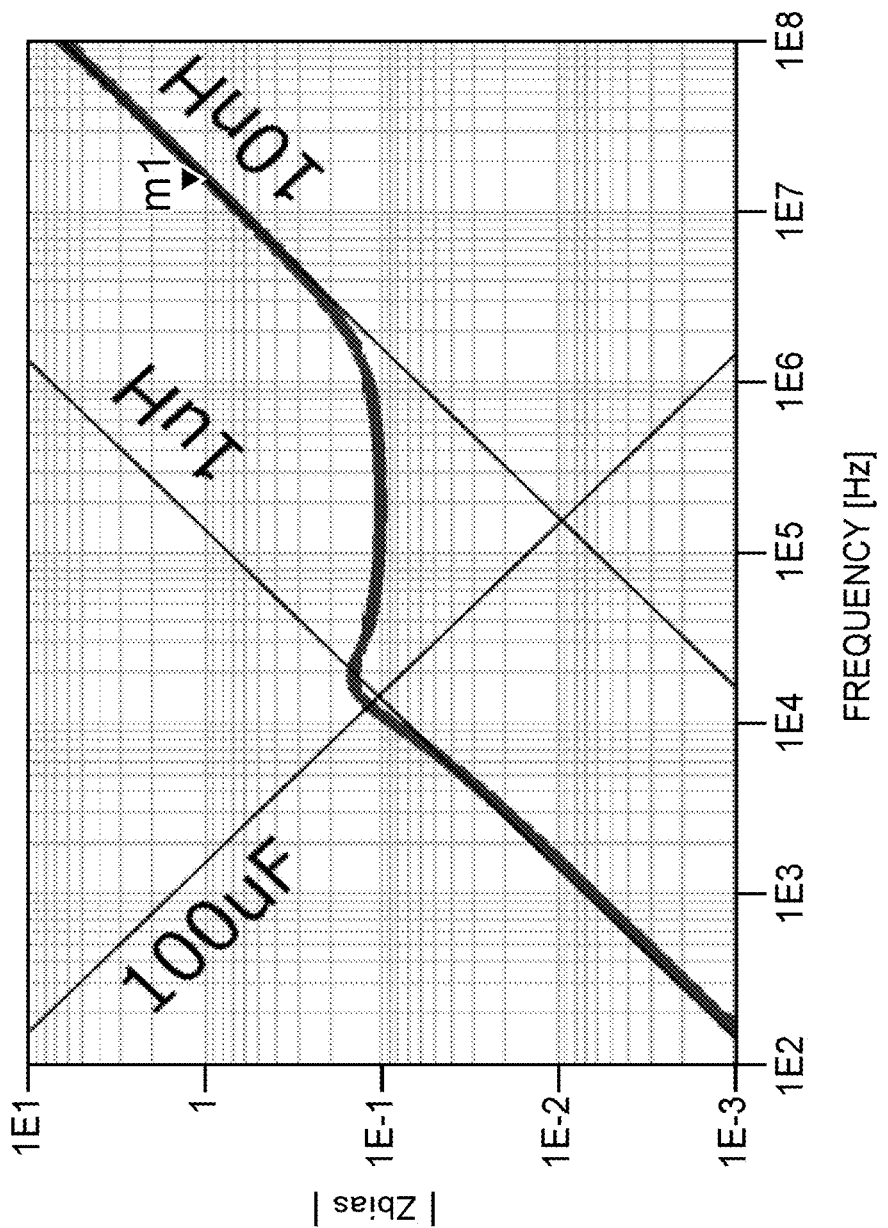
FIG. 11 is a characteristic diagram illustrating the frequency dependence of the Zbias impedance of the circuit of FIG. 10.

FIG. 11 is a characteristic diagram illustrating the frequency dependence of the impedance Zbias of the circuit of FIG. 10 (R1=0.1Ω, C1=100 µF, L1=1 µH, and L2=10 nH), and represents the simulation result. As illustrated in this diagram, since the inductor L2 is present, the impedance Zbias in a radio frequency band increases. In the example of FIG. 10, the impedance Zbias at 15.8 MHz reaches 1Ω, and the band width is insufficient for a wideband modulation signal used in a wireless LAN or many wireless devices such as mobile phones. Thus, the bias circuit of FIG. 10 cannot be used for the amplifier 2 that amplifies the radio frequency signal of which the wideband modulation signal is used.

In the characteristic of FIG. 11, since the decoupling capacitor C1 (=100 µF) and the inductor L1 (=1 µH) resonate in parallel, a resonance curve convex upward is drawn, and since the decoupling capacitor C1 (=100 µF) and the inductor L2 (=10 nH) resonate in series, a resonance curve convex downward is drawn.

In order to reduce the baseband impedance of the bias circuit in the wideband, it is necessary to suppress the inductance of the inductor L2 disposed in the vicinity of the output node n1 of the amplifier 2 to a target value or less. When the impedance of the target value is $X_0$ and the baseband bandwidth of the radio frequency signal output from the output node n1 of the amplifier 2 is f, an allowable inductance is expressed by Equation (8).

$$L \leq \frac{X_0}{2\pi f} \qquad (8)$$

When f=100 MHz and $X_0$<1Ω, L≤1.59 nH. When L=1 nH, the decoupling capacitor paired with the inductance is expressed by Equation (9).

$$C \geq \frac{L}{X_0^2} \qquad (9)$$

Here, since L2=1 nH and $X_0$=1Ω, C≥1 nF=1000 pF. From the aforementioned examination (when a loss is given to only one of Rc and Rl, a resistance value obtained by multiplying $X_0$ by a value greater than a threshold present between 1.4 and 1.6 is used, and thus, resonance does not occur), when a double margin is secured, since it can be seen that the peak of the impedance can be suppressed, C≥2000 pF is a design target value.

Figure 12:
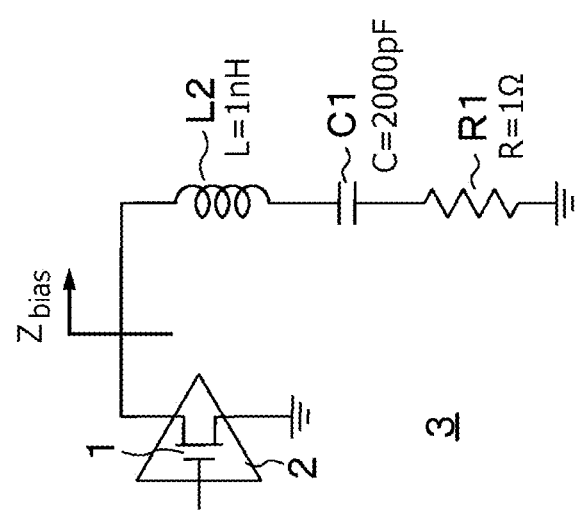
FIG. 12 is a circuit diagram in which a power supply path is omitted from the circuit of FIG. 10.
Figure 13:
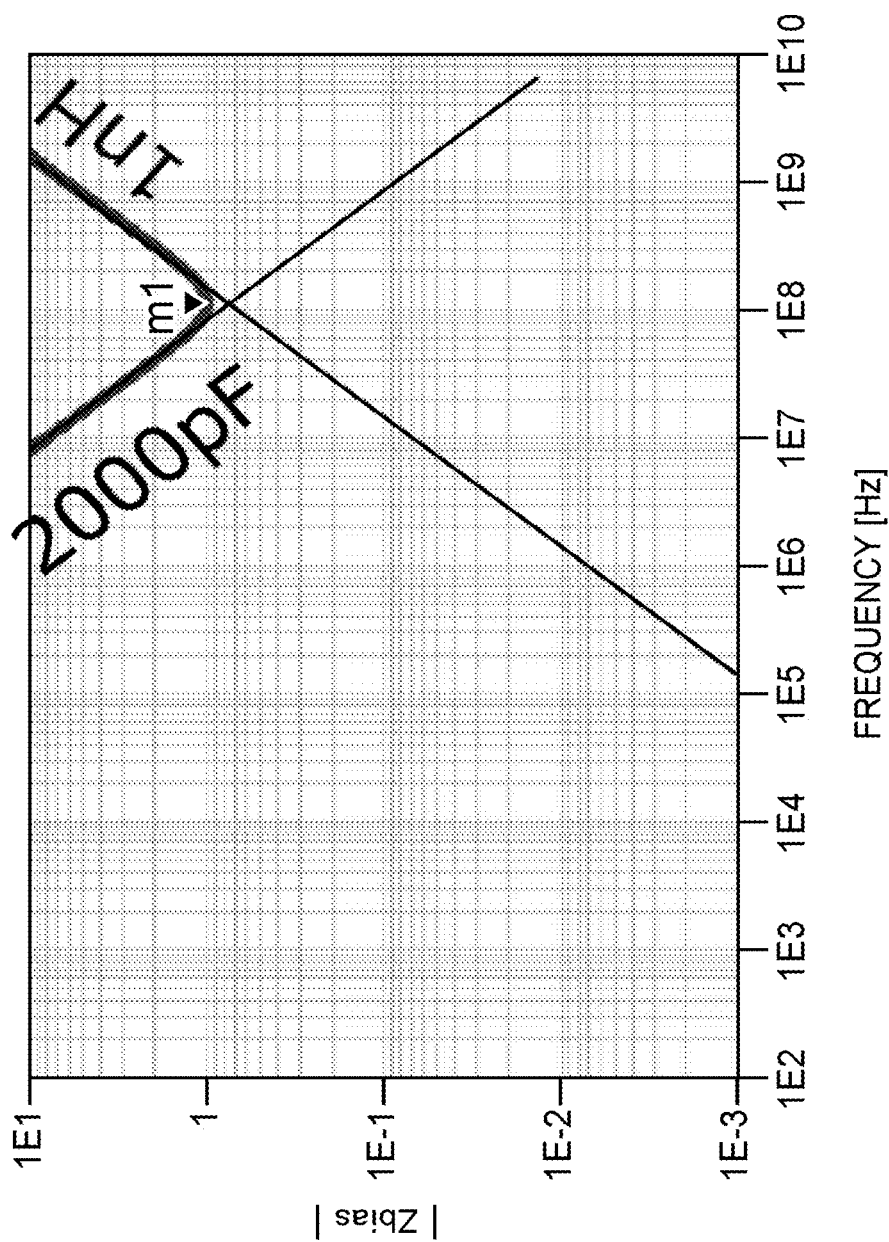
FIG. 13 is a characteristic diagram illustrating the frequency dependence of the Zbias impedance of the circuit of FIG. 12.

FIG. 12 is a circuit diagram in which the power supply path 5 is omitted from the circuit of FIG. 10, the inductor L2=1 nH, the decoupling capacitor C1=2000 pF, and the resistor R1=1Ω. FIG. 13 is a characteristic diagram illustrating the frequency dependence of the output impedance of the circuit of FIG. 12, and represents the simulation result. The impedance Zbias of FIG. 13 has characteristics as designed, and the impedance of 1Ω can be realized at 100 MHz. FIGS. 12 and 13 represent an LCR series resonance circuit and characteristics thereof, but the aforementioned examination results of the parallel resonance circuit can be applied with no change. In the case of the LCR series resonance circuit, the impedance at the resonance frequency is convex downward and deep attenuation appears, but this depth is given by R.

In the characteristics illustrated in FIG. 13, since the impedance at frequencies lower than the resonance frequency is high and a DC voltage cannot be supplied, a method of supplying a DC voltage is examined. First, an inductor that resonates in parallel with a capacitor C1 of 2000 pF is considered as in the example of the parallel resonance circuit of FIG. 3. Since $L<X_0^2C$, the inductance that can maintain 1Ω is L<2 nH.

Figure 14:
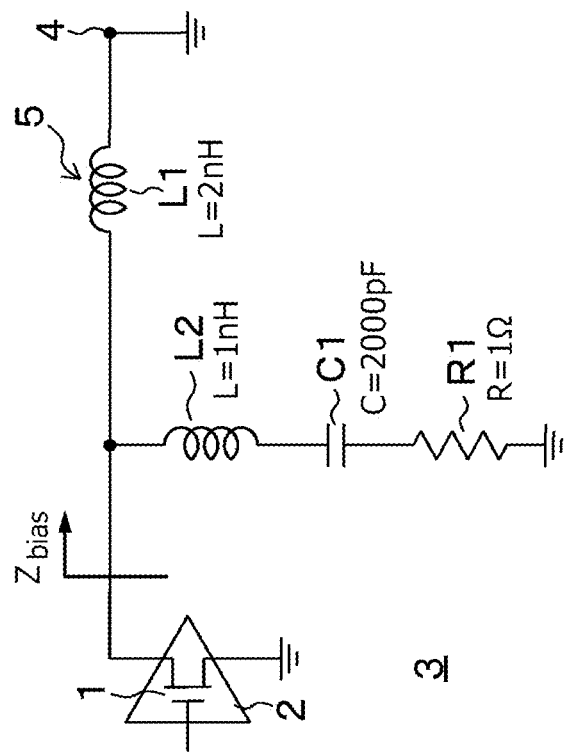
FIG. 14 is a circuit diagram in which the power supply path is added to the circuit of FIG. 12.
Figure 15:
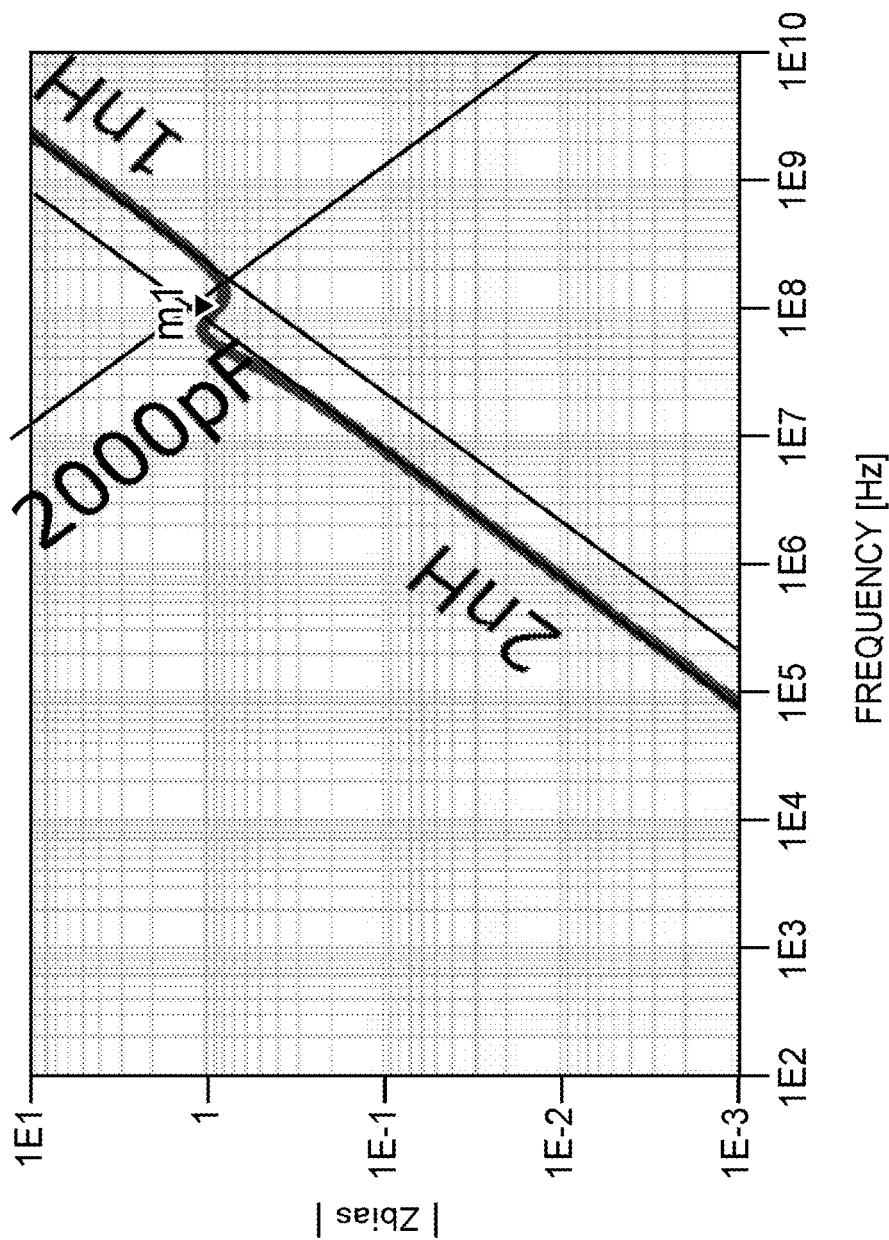
FIG. 15 is a characteristic diagram illustrating the frequency dependence of the Zbias impedance of the circuit of FIG. 14.

FIG. 14 is a circuit diagram in which the power supply path 5 having the inductor L1 of 2 nH that resonates in parallel with the decoupling capacitor C1 is added to the circuit of FIG. 12. FIG. 15 is a characteristic diagram illustrating the frequency dependence of the impedance of the baseband equivalent circuit of FIG. 14, and represents the simulation result.

The inductor L1 is added, and thus, the impedance in the low frequency region can be lowered as illustrated in FIG. 15. However, it is difficult to realize the circuit of FIG. 14. The reason is that the power supply path 5 of the radio frequency circuit 3 is generally a λ/4 transmission line, that is, a short stub in many cases. The inductance of the power supply path 5 of the radio frequency circuit 3 is expressed by Equation (10). In Equation (10), $f_{RF}$ is a frequency to be cut off (usually the carrier frequency of the radio frequency signal to be amplified).

$$L_{\frac{\lambda}{4}} = \frac{Z_0}{4 f_{RF}} \qquad (10)$$

Figure 17:
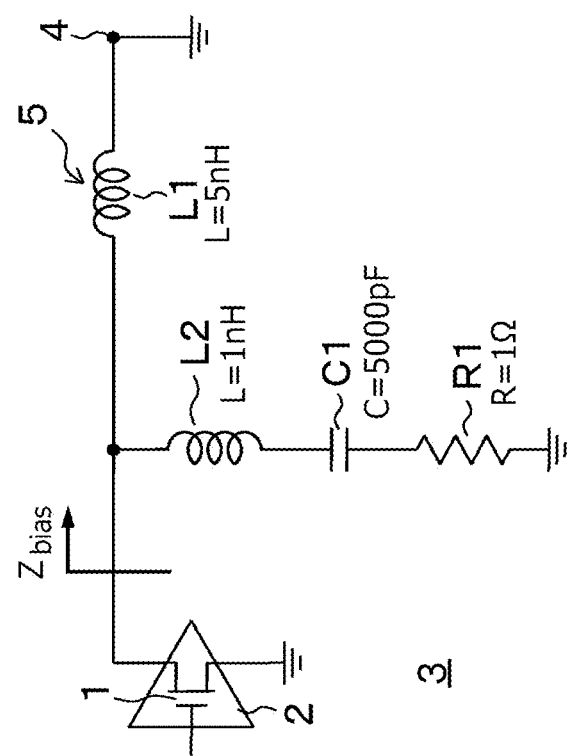
FIG. 17 is a circuit diagram in which an inductance of the power supply path is 5 nH.
Figure 18:
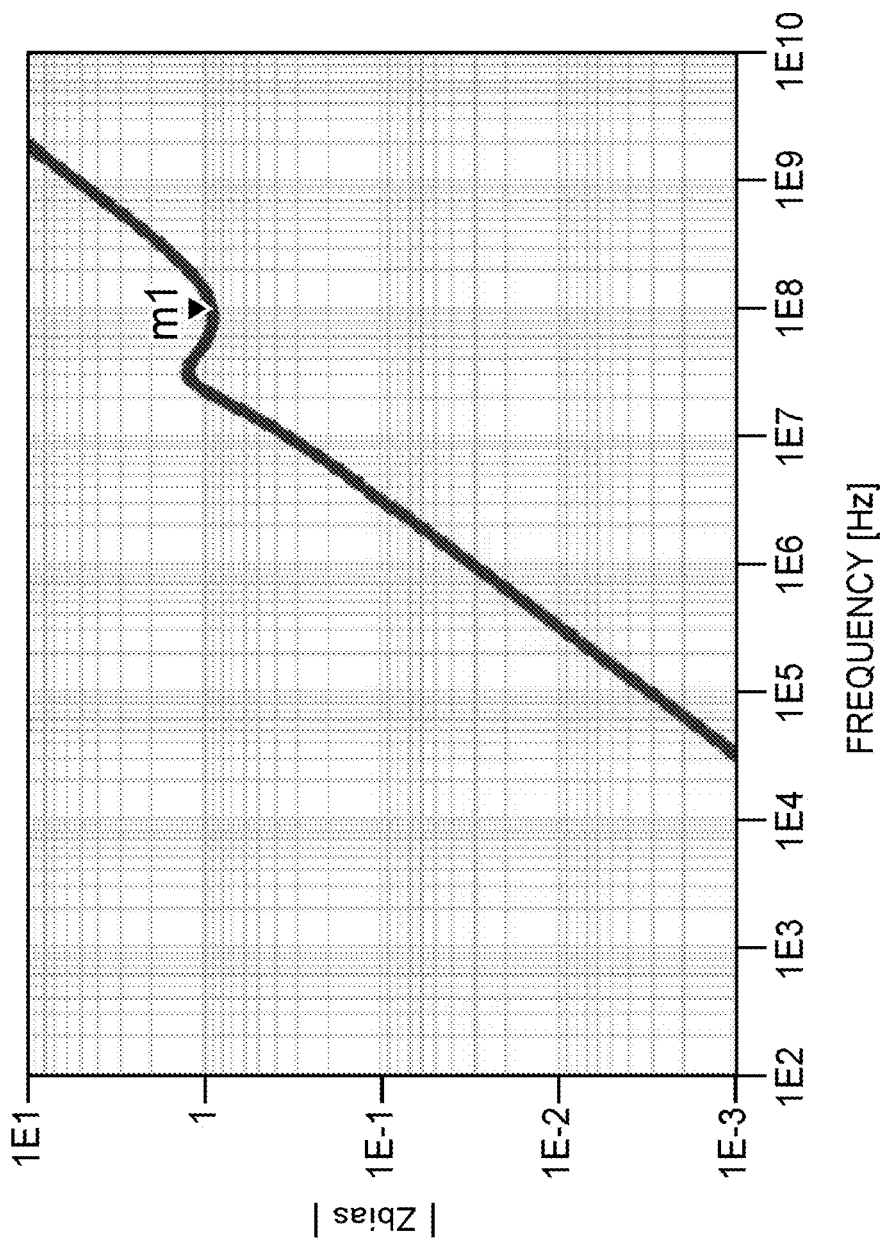
FIG. 18 is a characteristic diagram illustrating the frequency dependence of the Zbias impedance of the circuit of FIG. 17.

FIG. 16 is a diagram illustrating a correspondence between $f_{RF}$ and $L_{\lambda/4}$. For example, when it is assumed from FIG. 16 that the frequency of the radio frequency signal is approximately 2 GHz, the calculation is performed again by using the impedance of the power supply path 5 as 5 nH, and thus, the circuit illustrated in FIG. 17 is obtained. FIG. 18 is a characteristic diagram illustrating the frequency dependence of the Zbias impedance of the circuit of FIG. 17, and represents the simulation result.

In the circuit of FIG. 17, the decoupling capacitor C1 increases from 2000 pF to 5000 pF in FIG. 14 such that the target impedance satisfies L1=5 nH by using $X_0$=1Ω, but since a condition that satisfies $X_0=1\Omega$ or less also in the relationship with L2 is C>1000 pF, there is no problem.

In the circuit of FIG. 17, the resistor R1 of 1Ω connected in series with the decoupling capacitor C1 is for setting the impedance during the parallel resonance between the resistor R1 and the inductor L1 to 1Ω. Even though this resistor R1 is connected in series with the inductor L1, there is no problem in terms of electrical characteristics as illustrated in Equation (6). Actually, since the arrangement of the components is crowded in the vicinity of the amplifier 2, it is easy to mount the components in a case where the resistor R1 is moved to a side of the inductor L1.

Figure 19:
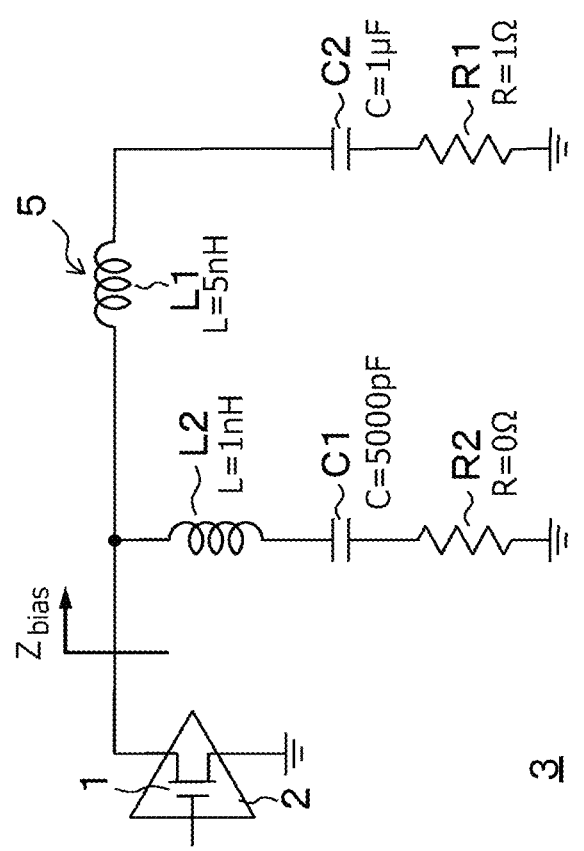
FIG. 19 is a circuit diagram of the radio frequency circuit in which a resistor is connected in series with an inductor.
Figure 20:
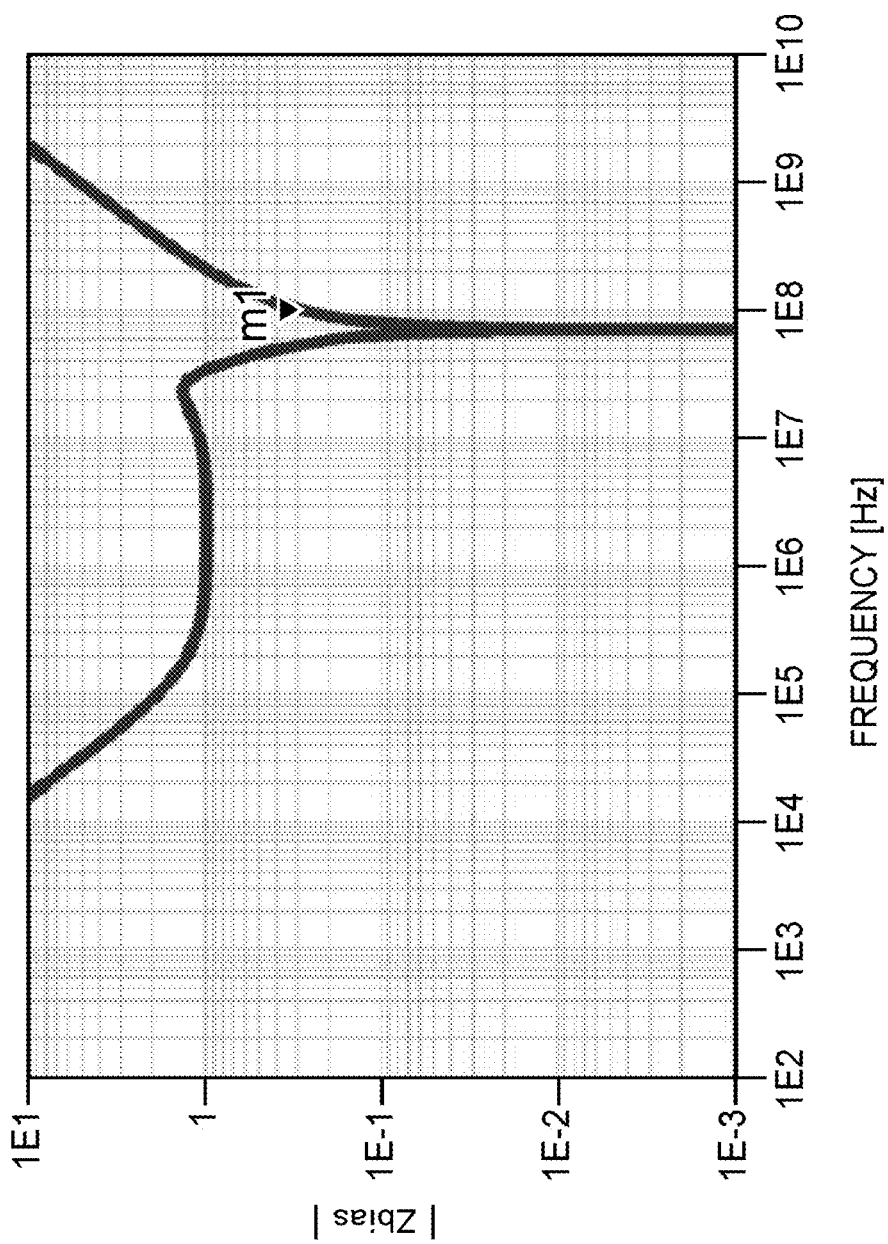
FIG. 20 is a characteristic diagram illustrating the frequency dependence of the Zbias impedance of the circuit of FIG. 19.

FIG. 19 is a baseband equivalent circuit diagram of the radio frequency circuit 3 in which the resistor R1 is connected in series with the inductor L1. More specifically, the inductor L1, a decoupling capacitor C2, and the resistor R1 are connected in series. The capacitance of the decoupling capacitor C2 is 1 µF. FIG. 20 is a characteristic diagram illustrating the frequency dependence of the impedance Zbias of the circuit of FIG. 19, and represents the simulation result. In the circuit of FIG. 19, a resistor R2 is connected in series with the decoupling capacitor C1, but in the simulation, a resistance value of the resistor R2 is set to 0Ω.

The resistance value of the resistor R2 can be set to any resistance value as illustrated in Equation (6) if necessary. The resistor R2 is set to 0Ω, a deep drop in impedance is seen around 71.2 MHz due to series resonance caused by the inductor L2 of 1 nH and the decoupling capacitor C1 of 5 nF. This depth can be adjusted by using R2.

Although the loss of the circuit changes from the resistor R2 to the resistor R1, an effect of suppressing the peak of the anti-resonance between the decoupling capacitor C2 to be described below and a DC power supply inductor that resonates in parallel is also provided. As will be described below, since the resistor R2 relies only on the inductance of the inductor L2 in order to block the radio frequency signal, the connection of the resonance circuit including L2 and C1 to the path of the high-impedance radio frequency signal is limited. However, when the loss is given to the resistor R1, the resistor R1 can reduce the loss in the radio frequency band by the inductor L1 (short stub) to which a high impedance is given at a radio frequency. As described above, the loss is given to the resistor R1 instead of the resistor R2, and thus, it is possible to achieve both characteristics and simplification of the circuit.

As can be seen from the characteristics of FIG. 20, the impedance near 100 MHz can be maintained at 1Ω in the circuit of FIG. 19.

Next, a case where the inductor for supplying a bias voltage is connected to the circuit of FIG. 19 is examined. As examined so far, since it is necessary to satisfy the condition in which the impedance is maintained at 1Ω in parallel resonance with respect to 1 µF of the decoupling capacitor C2, a target inductance of the newly connected inductor is 1 µH or less.

Figure 21:
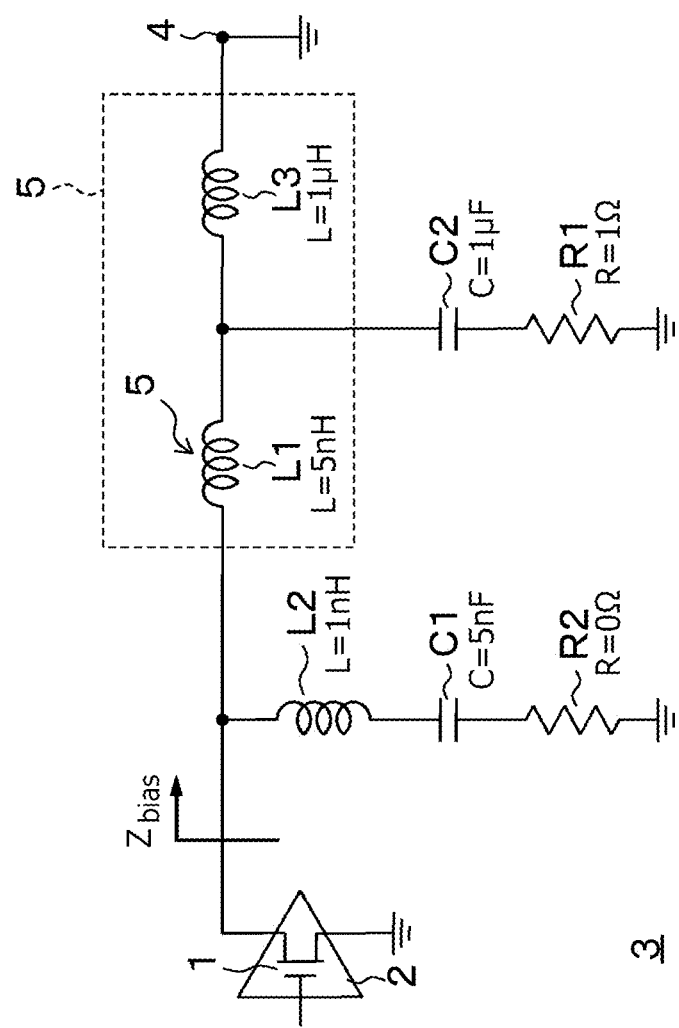
FIG. 21 is a circuit diagram of the radio frequency circuit to which the inductor connected to the power supply node is added.
Figure 22:
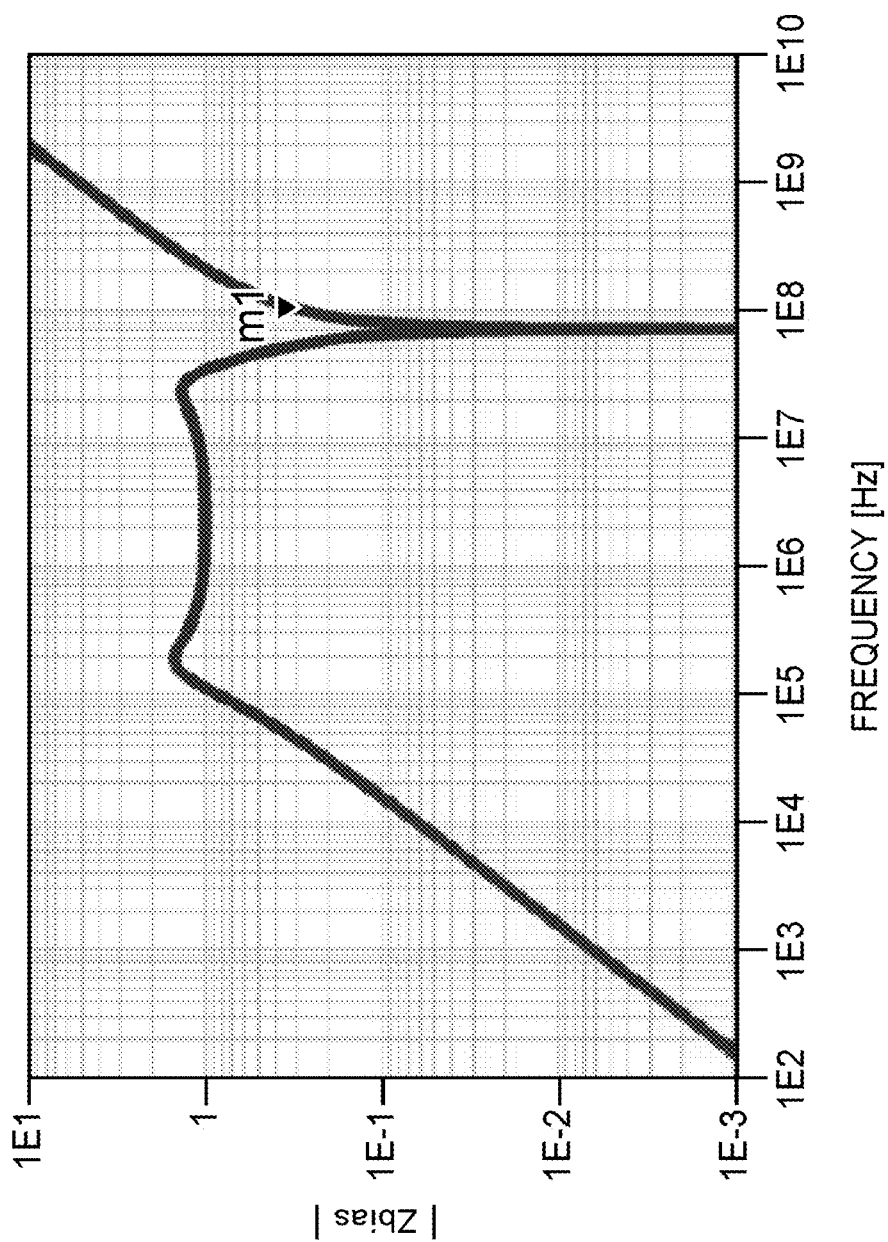
FIG. 22 is a characteristic diagram illustrating the frequency dependence of the Zbias impedance of the circuit of FIG. 21.

FIG. 21 is a baseband equivalent circuit diagram of the radio frequency circuit 3 to which an inductor L3 connected to the power supply node 4 is added. An inductance of the inductor L3 is 1 µH. FIG. 22 is a characteristic diagram illustrating the frequency dependence of the Zbias impedance of the circuit of FIG. 21, and represents the simulation result.

The inductor L3 is connected as illustrated in FIG. 21, and thus, the low frequency impedance is lowered as illustrated in FIG. 22. Accordingly, the bias voltage can be supplied, but there is a point to be careful in the design of this circuit.

First, 1 µH is selected as the maximum inductance at which a target impedance is obtained for C2=1 µF as illustrated in FIG. 21. A large inductance of as 1 µH has a parasitic capacitance, and this parasitic capacitance causes the series resonance with the inductor L1 of 5 nH. Since the impedance of this series resonance is a characteristic convex downward and there is an attempt to lower the impedance, there is no problem. However, since this parasitic capacitance C3 is in parallel with the resistor R1, when an impedance of C3 is low at the parallel resonance frequency of the inductor L1 and the capacitor C1, the effect of the resistor R1 is weakened, the anti-resonance between the inductor L1 and the capacitor C1 is strong, and the peak of the impedance is high.

Figure 23:
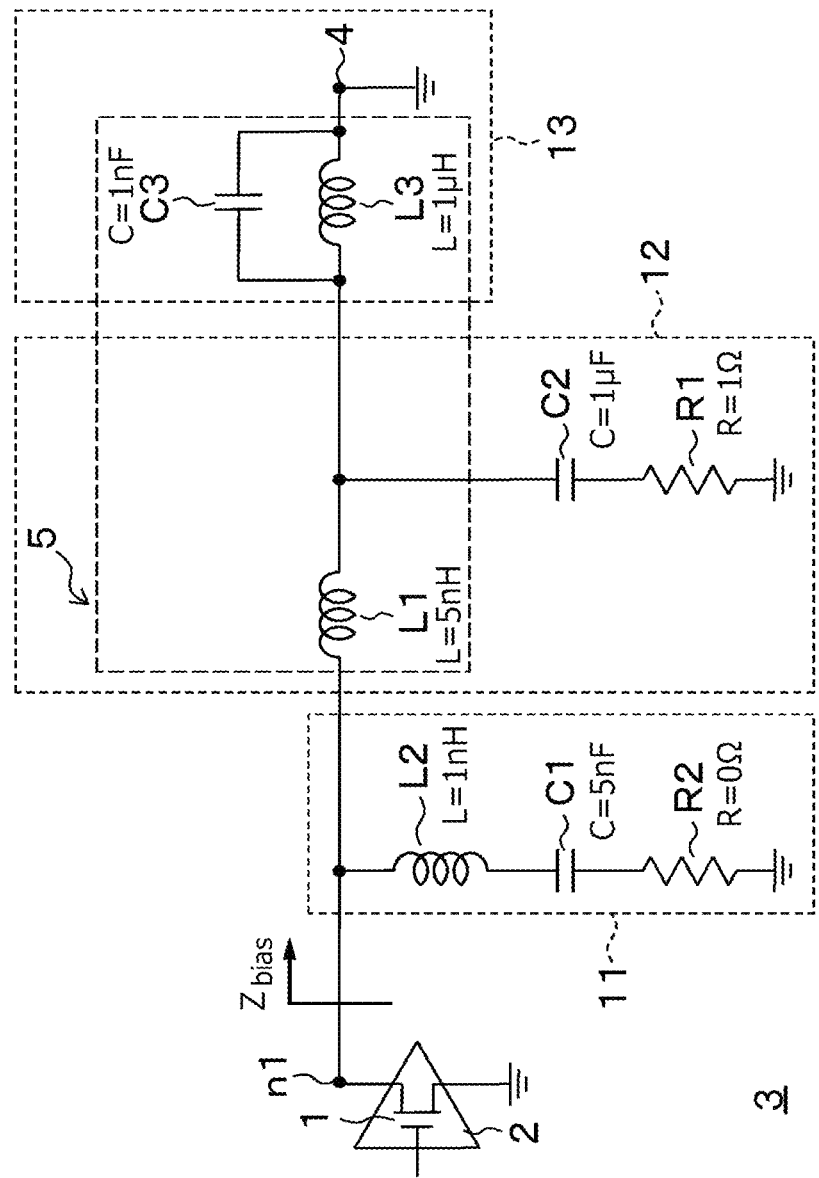
FIG. 23 is a circuit diagram of the radio frequency circuit in which a parasitic capacitance is connected in parallel with the inductor.
Figure 24:
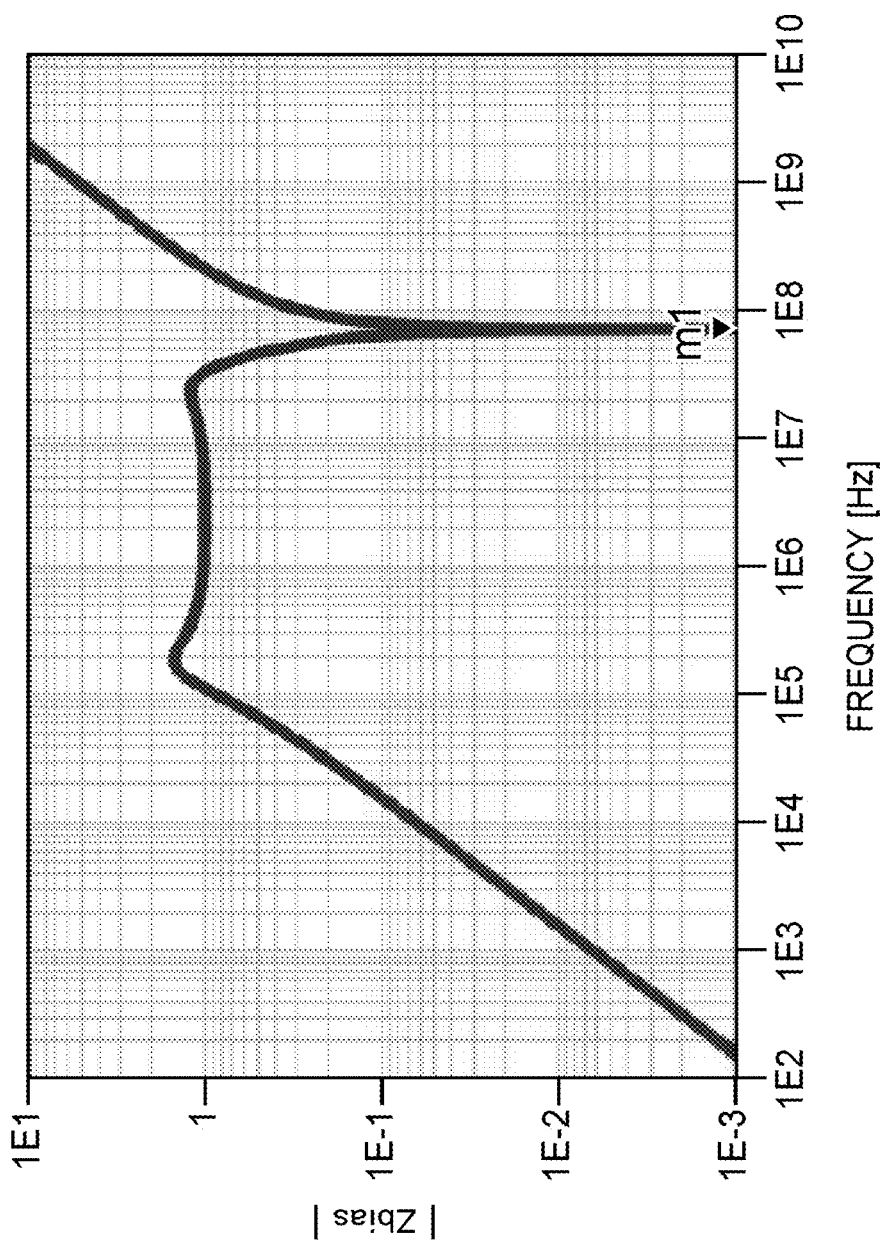
FIG. 24 is a characteristic diagram illustrating the frequency dependence of the Zbias impedance of the circuit of FIG. 23.

FIG. 23 is a baseband equivalent circuit diagram of the radio frequency circuit 3 in which the parasitic capacitance C3 is connected in parallel with the inductor L3. FIG. 24 is a characteristic diagram illustrating the frequency dependence of the impedance of the circuit of FIG. 23, and represents the simulation result.

The radio frequency circuit 3 of FIG. 23 includes a first resonator 11, a second resonator 12, and a third resonator 13 of the inductor L3. One end of the first resonator 11 is connected between the output node n1 of the amplifier 2 and the power supply path 5, and the other end is connected to a reference voltage node (for example, ground node). The first resonator 11 is a series resonance circuit in which the inductor L2 of 1 nH, the decoupling capacitor C1 of 5 nF, and the resistor R2 are connected in series. In FIG. 23, the resistance value of the resistor R2 is expressed as 0Ω, but the frequency dependence of the impedance of the radio frequency circuit 3 in FIG. 23 can be controlled by adjusting the resistance value of the resistor R2.

The inductor L1 and the inductor L3 are connected in series at the power supply path 5 in FIG. 23. The second resonator 12 is a series resonance circuit in which the inductor L1, the decoupling capacitor C2, and the resistor R1 are connected in series. More specifically, the decoupling capacitor C2 and the resistor R1 are connected in series between a connection node between the inductor L1 and the inductor L3 and a reference voltage node (for example, ground node).

The third resonator 13 is a parallel resonance circuit in which the inductor L3 and the capacitor C3 such as a parasitic capacitance of the inductor L3 are connected in parallel. More specifically, the inductor L3 and the capacitor C3 are equivalently connected in parallel between one end of the inductor L1 and the reference voltage node (for example, ground node, however, as shown in FIG. 23, it is actually connected to the voltage supply node 4).

In the radio frequency circuit 3 of FIG. 23, the series resonance circuit of the capacitor C3 and the inductor L1 and the series resonance circuit of the decoupling capacitor C1 and the inductor L2 resonate in parallel, and the inductor L1 and the decoupling capacitor C1 resonate in parallel. Since these series resonance circuits have no resistor component, sharp high anti-resonance is likely to occur due to the parallel resonance of the inductor L1 and the decoupling capacitor C1.

More specifically, in the circuit of FIG. 23, a parallel resonance frequency of the third resonator 13 including the inductor L3 of 1 µH and the parasitic capacitance C3 of 1 nF is 5 MHz, and a resonance frequency of the series resonance circuit including the parasitic capacitance C3 of 1 nF and the inductor L1 of 5 nH is 71.2 MHz, a resonance frequency of the first resonator 11 including the series resonance circuit including the decoupling capacitor C1 of 5 nF and the inductor L2 of 1 nH is 71.2 MHz, and a parallel resonant frequency of the decoupling capacitor C1 of 5 nF and the inductor L1 of 5 nH is 31.8 MHz. In order to suppress the peak of the parallel resonance at 31.8 MHz to about 1Ω, R1 of 1Ω is provided. However, since the parasitic capacitance C3 is equivalently connected in parallel with R1, when the impedance of C3 at 31.8 MHz is a significant impedance for 1Ω of R1, the peak of the parallel resonance cannot be maintained at 1Ω. In the example of FIG. 23, since the impedance of C3 of 31.8 MHz is 5Ω which is greater than 1Ω, the real part of C3 and R1 connected in parallel is 0.96Ω, and a remarkable increase in impedance due to anti-resonance is avoided. In FIG. 24, the peak of the impedance of 31.8 MHz is substantially the same as that in FIG. 22 without including the parasitic capacitance C3.

The impedance Zbias in FIG. 24 is a case where the parasitic capacitance C3 is 1 nF, and there is almost no anti-resonance due to the parallel resonance as described above. However, the anti-resonance due to the parallel resonance increases as the capacitance of the parasitic capacitance C3 increases.

Figure 25:
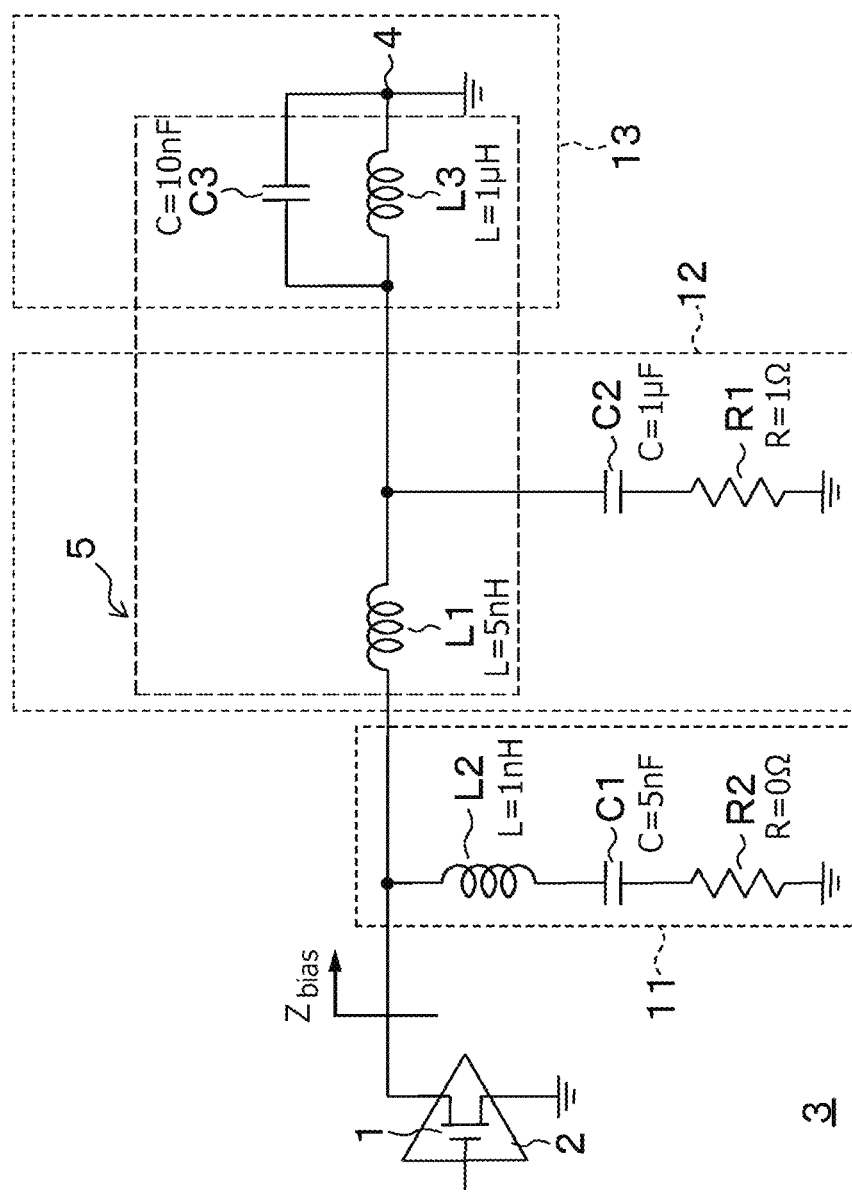
FIG. 25 is a circuit diagram when the parasitic capacitance is 10 nF.
Figure 26:
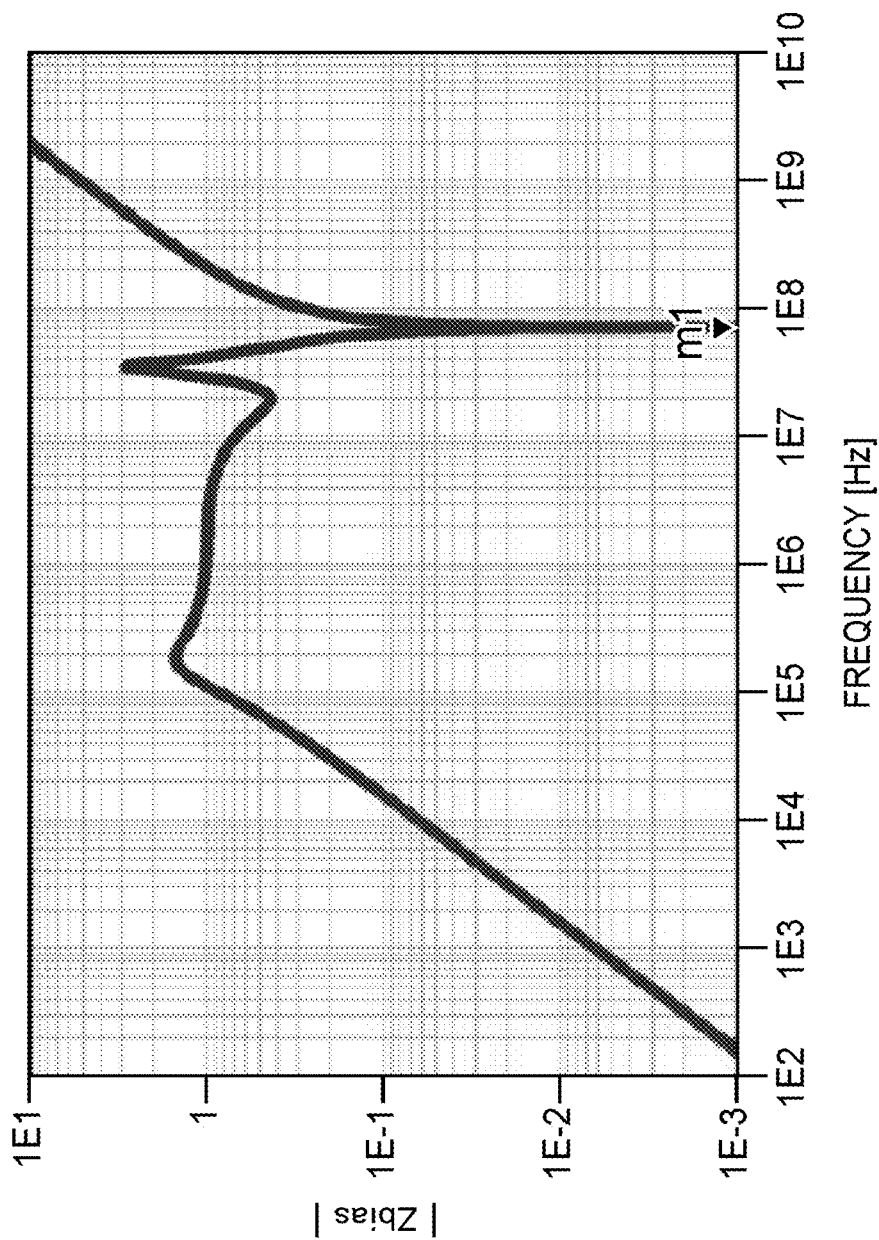
FIG. 26 is a characteristic diagram illustrating the frequency dependence of the Zbias impedance of the circuit of FIG. 25.

FIG. 25 is a circuit diagram when the parasitic capacitance C3 is 10 nF, and FIG. 26 is a characteristic diagram illustrating the frequency dependence of the impedance of the circuit of FIG. 25, and represents the simulation result.

As illustrated in FIG. 26, when the parasitic capacitance C3 is 10 nF, the aforementioned effect of the parallel resonance of the inductor L1 and the decoupling capacitor C1 is exhibited, and the peak of the impedance caused by the anti-resonance occurs near 31.8 MHz. Since the impedance of C3 at 31.8 MHz decreases to 0.5Ω, the real part of the impedance due to the parallel connection with R1 is 0.2Ω, and the impedance of the anti-resonance cannot be suppressed to 1Ω by design. In FIG. 26, a decrease in impedance due to the series resonance caused by the inductor L1 of 5 nH and the parasitic capacitance C3 of 10 nF is also seen near 22.5 MHz. When the parasitic capacitance C3 becomes 100 nF, since the impedance of C3 at 31.8 MHz decreases to 0.05Ω and the real part of the impedance connected in parallel with R1 also decreases to 2.5 mΩ, the peak of the impedance due to anti-resonance further increases. The series resonance frequency of C3 and L1 also decreases to 7.12 MHz, and the decrease in impedance due to the series resonance is also deepened. Since the resonance frequency of the parasitic capacitance C3 of 10 nF and the inductor L3 of 1 μH is 1.59 MHz, the parasitic capacitance C3 does not become so large that there is a problem at the anti-resonance of the third resonator 13 unless a considerably large inductor is used, but attention is required.

In the present embodiment, when a large value is selected as the value of the inductor L3 which is a component of the third resonator 13 as stated above, the target impedance $X_0$ at the parallel resonance frequency of C1 and L1 needs to be selected as the value of the parallel capacitor C3 such that the real part of the impedance of R1 and C3 connected in parallel can be satisfied. The real part of the impedance of C and R connected in parallel is obtained by $R/(1+\omega^2 C^2 R^2)$. It is desirable that the series resonance frequency of the inductor L1 and the parasitic capacitance C3 is set to be greater than the parallel resonance frequency of the inductor L1 and the decoupling capacitor C1. Accordingly, a peak of the sharp anti-resonance does not appear.

Figure 27:
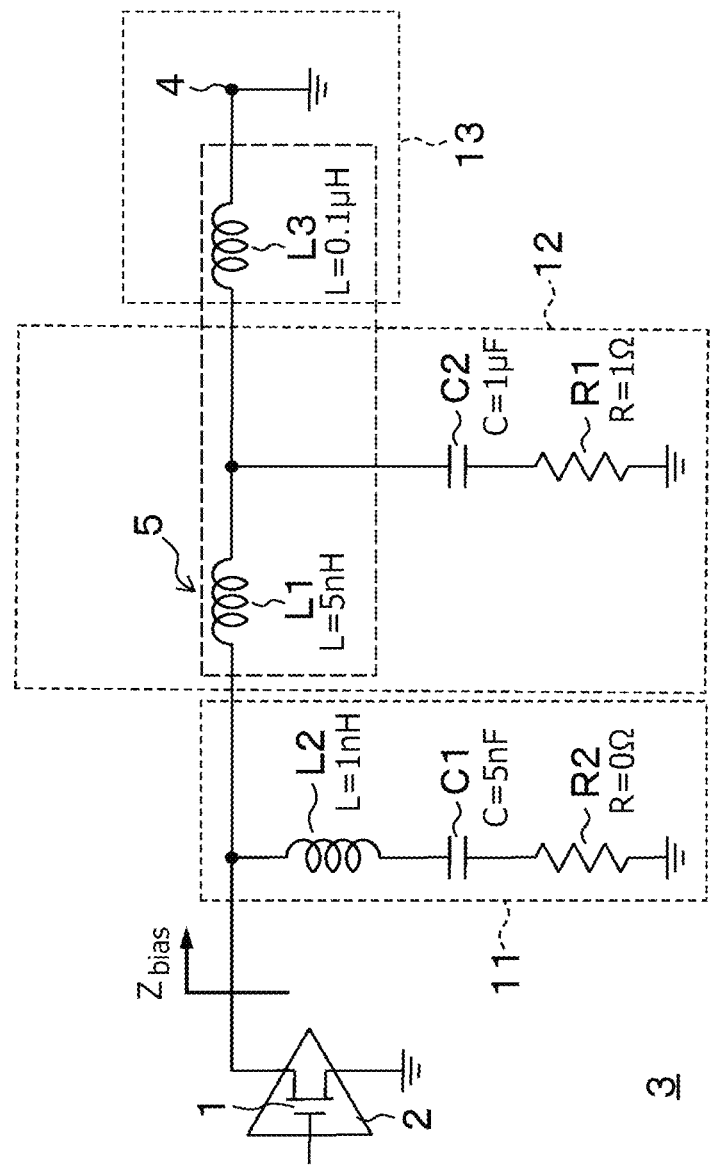
FIG. 27 is a circuit diagram of the radio frequency circuit in which an inductance of an inductor of a third resonator is 0.1 μH.
Figure 28:
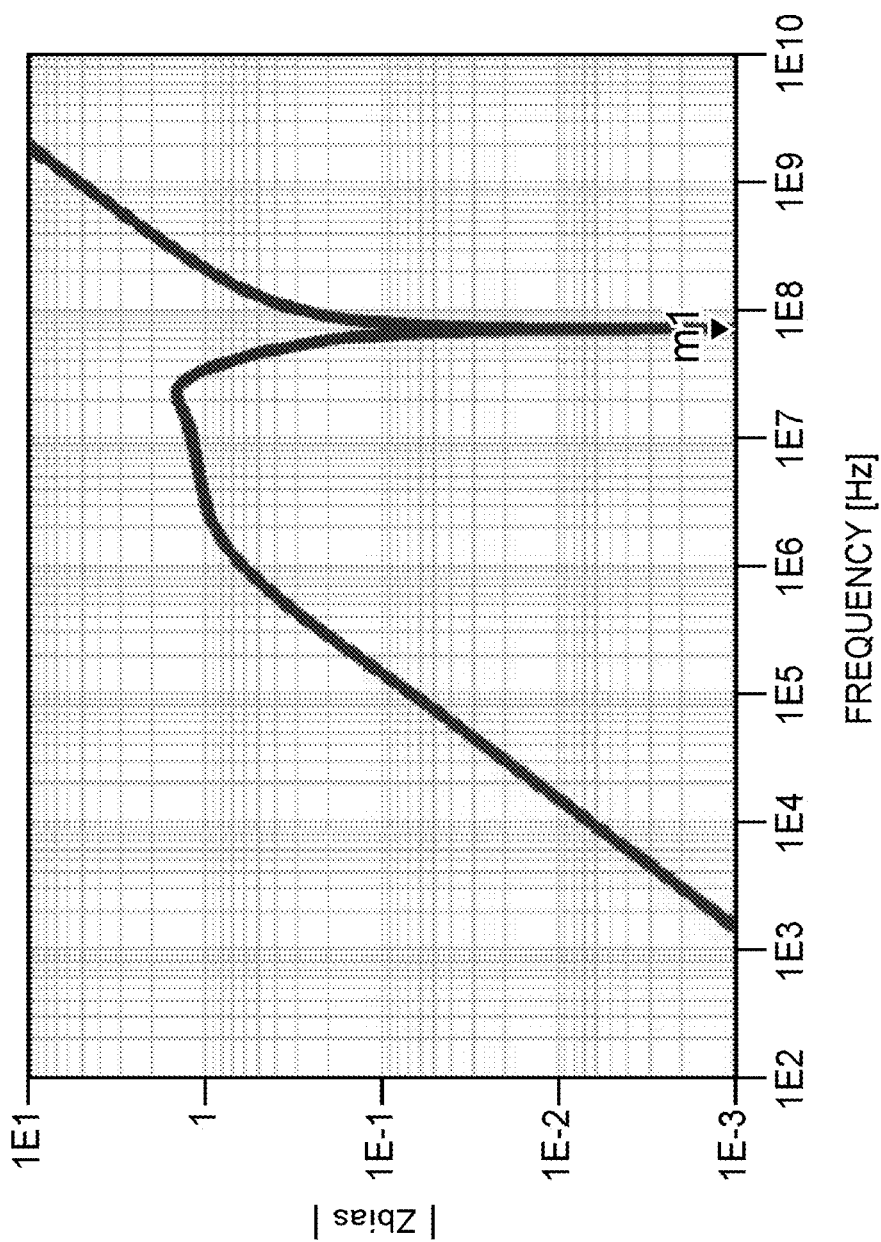
FIG. 28 is a characteristic diagram illustrating the frequency dependence of the Zbias impedance of the circuit of FIG. 27.

When the inductance of the inductor L3 of the third resonator 13 is reduced, a method of suppressing the peak of the anti-resonance is different from the aforementioned method. FIG. 27 is a circuit diagram of the radio frequency circuit 3 in which the inductance of the inductor L3 of the third resonator 13 is 0.1 μH. FIG. 28 is a characteristic diagram illustrating the frequency dependence of the Zbias impedance of the circuit of FIG. 27, and represents the simulation result.

When the inductance of the inductor L3 is reduced, since the parasitic capacitance is also reduced, the description of the parasitic capacitance connected in parallel with the inductor L3 is omitted in FIG. 27.

As illustrated in FIG. 28, even though the inductance of the inductor L3 is reduced, when the real part of the impedance of the inductor L3 and the resistor R1 connected in parallel satisfies the target impedance $X_0$, the peak of the anti-resonance can be suppressed while favorably maintaining the absolute value of the Zbias impedance Zbias. When the inductor L3 is 0.1 μH, the real part of the impedance at 31.8 MHz connected in parallel with the resistor R1 of 1Ω is 0.9975Ω which substantially satisfies the target impedance of 1Ω. The real part is given by $R=\omega^2 L^2 R/(R^2+\omega^2 L^2)$.

Figure 29:
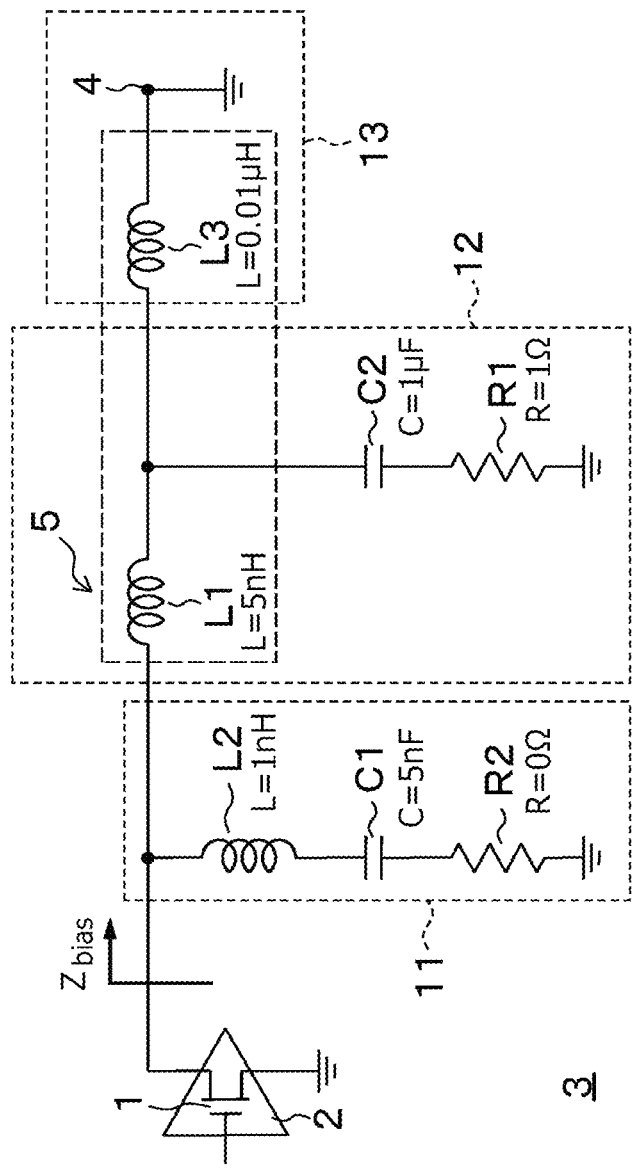
FIG. 29 is a circuit diagram of a radio frequency circuit 3 in which the inductance of the inductor of the third resonator is reduced to 0.01 μH.
Figure 30:
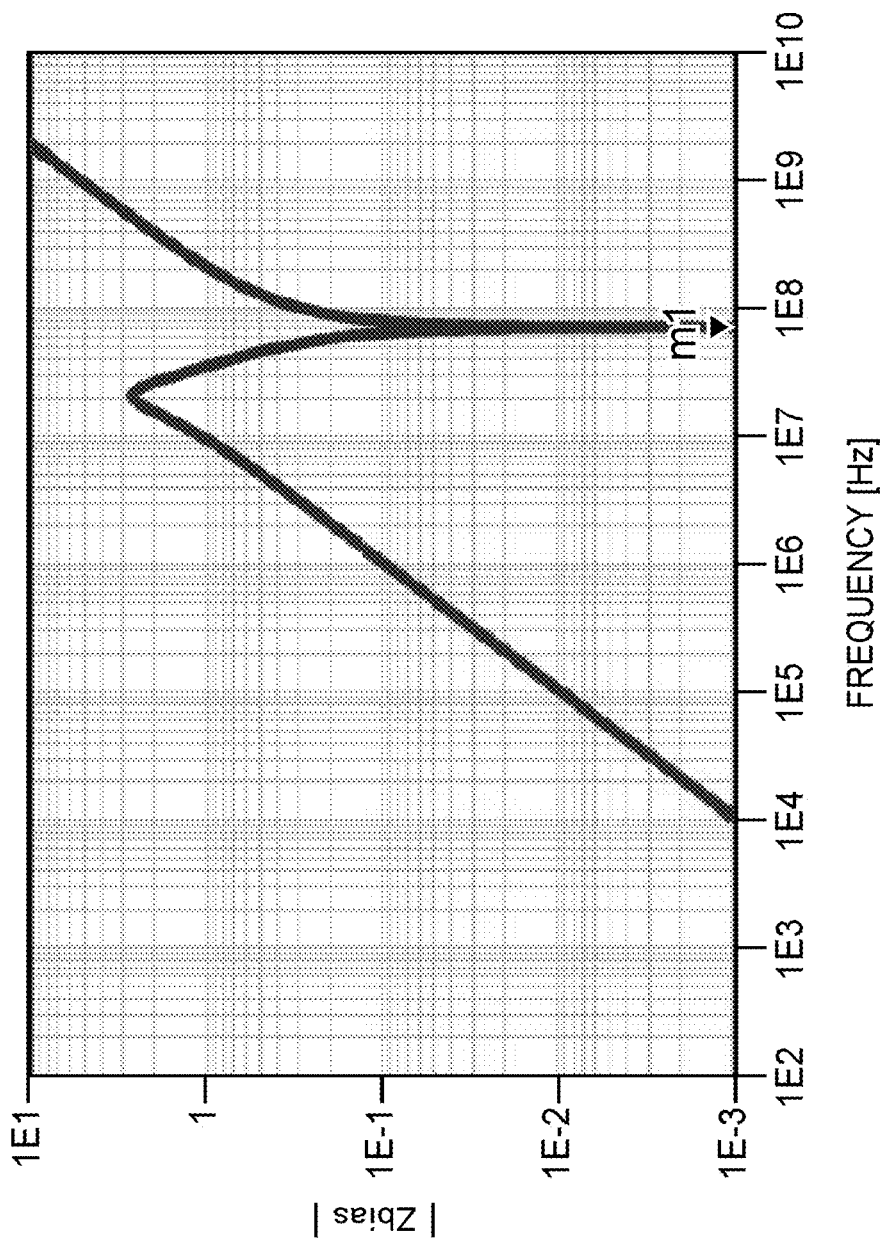
FIG. 30 is a characteristic diagram illustrating the frequency dependence of the Zbias impedance of the circuit of FIG. 29.

Next, it is considered that the inductance of the inductor L3 of the third resonator 13 is further reduced. FIG. 29 is a circuit diagram of the radio frequency circuit 3 in which the inductance of the inductor L3 of the third resonator 13 is reduced to 0.01 μH. FIG. 30 is a characteristic diagram illustrating the frequency dependence of the Zbias impedance of the circuit of FIG. 29, and represents the simulation result.

As illustrated in FIG. 30, when the inductance of the inductor L3 of the third resonator 13 is reduced to 0.01 μH, the peak impedance of the anti-resonance increases at about 20 MHz. When the inductance of the inductor L3 is too small, an effect of setting the resistor R1 within the second resonator 12 to be 1Ω cannot be obtained. More specifically, when the resistor R2 within the first resonator 11 is 0Ω, only the resistor R1 determines the pear of the overall resonance in the first to third resonators 11 to 13. Therefore, the sharpness of the peak of the anti-resonance of the parallel resonance circuit of the inductor L1 and the decoupling capacitor C1 depends on the resistor R1. When the inductor L2 within the second resonator L1=5 nH and the decoupling capacitor C1=5 nF, $X_0$=1Ω, and an appropriate resistance value of the resistor R1 is 1Ω. Therefore, when the resistor R1 is 1Ω, the peak of the anti-resonance does not originally appear.

However, when the inductor L3=0.01 μH, since 0.01 μH becomes the impedance of 1.26Ω at 20 MHz at which anti-resonance occurs, this impedance is substantially the same as that in a case where the resistor R1 is 1Ω. Accordingly, a current at the power supply path 5 passes through the inductor L3 without passing through the resistor R1, and thus, a component reaching the ground increases. That is, this case is equivalent to a case where the resistor R1 decreases, and the effect of the resistor R1 cannot be obtained, and a sharp peak appears at the anti-resonance frequency. The anti-resonance occurs between the impedance of the inductor L1 and the inductor L3 connected in series and the decoupling capacitor C1. The resonance frequency decreases to about 18.4 MHz, and thus, the effect that the impedance of the inductor L3 approaches the resistor R1 is also added.

The impedance due to the inductance of the inductor L3 decreases to the same value as the impedance due to the resistance value of the resistor R1, and thus, such a defect occurs. As a result, the impedance is increased by connecting the capacitor C3 such as the parasitic capacitance in parallel with the inductor L3, and thus, the peak of the anti-resonance can be suppressed.

A resistor in addition to the capacitor C3 is added within the third resonator 13, and thus, Q of resonance can be lowered. This resistor can be replaced with a parallel resistor of C3 by parallel-to-serial conversion. In this case, the same effect can be obtained by updating the value of the resistor R1 to a combined resistance value.

Figure 31:
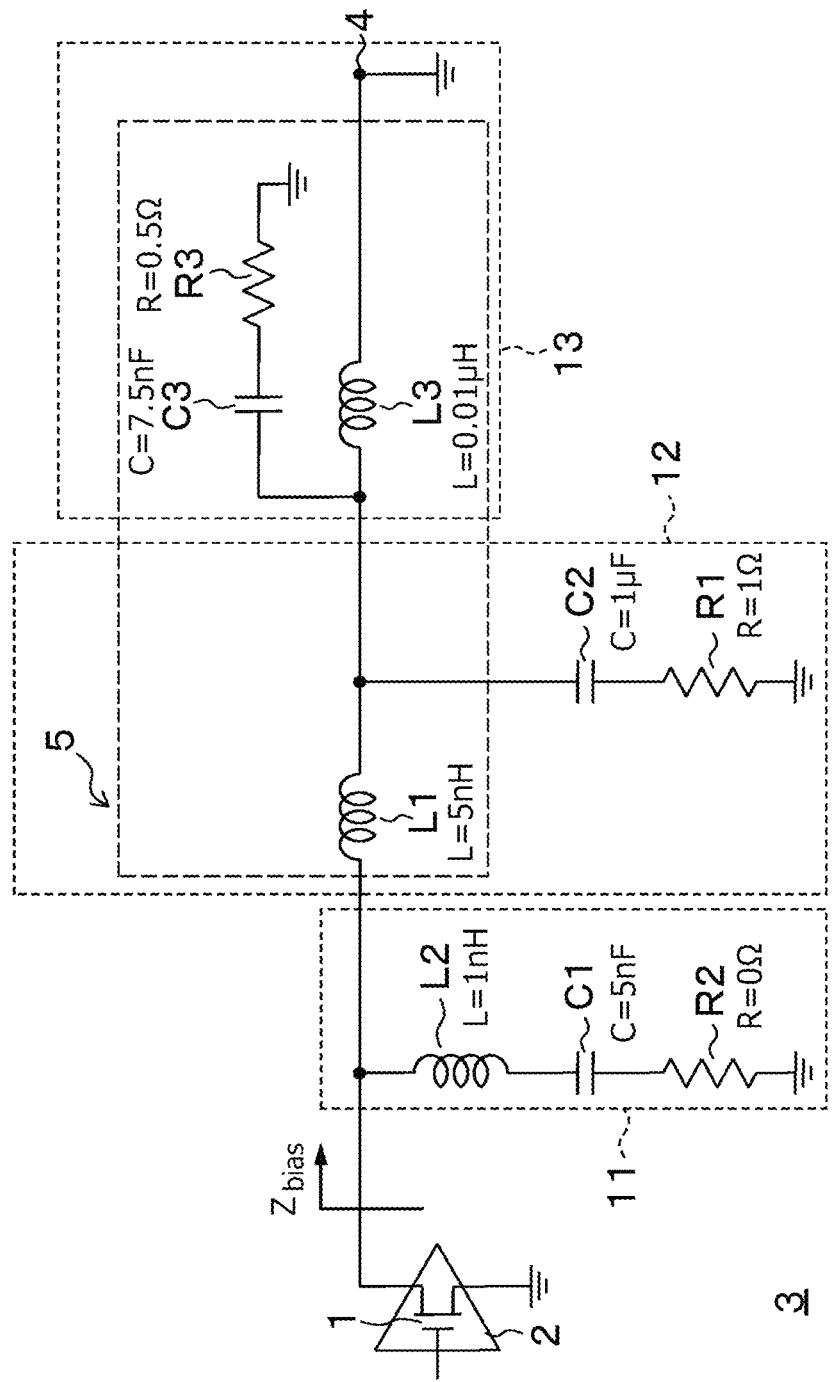
FIG. 31 is a circuit diagram of the radio frequency circuit in which a capacitor and a resistor are added within the third resonator.
Figure 32:
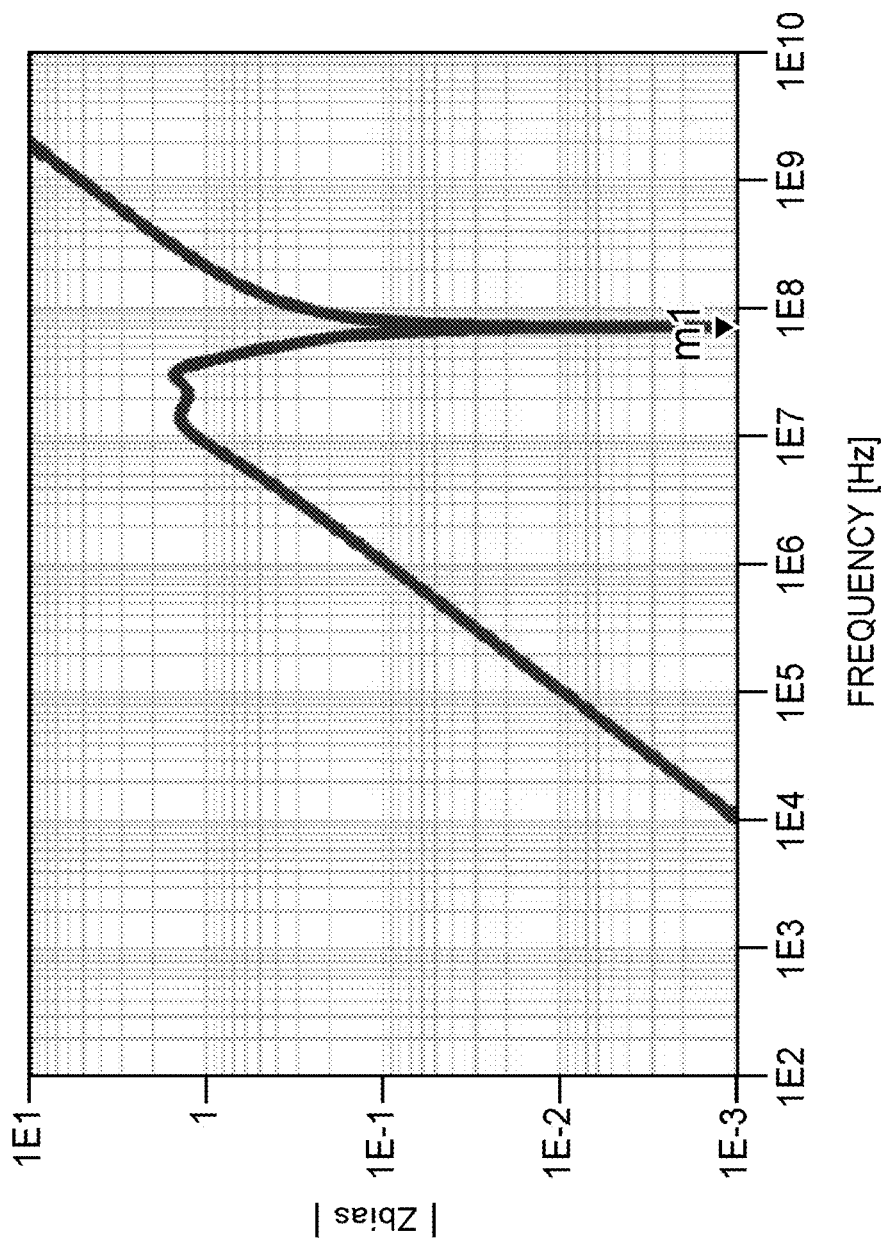
FIG. 32 is a characteristic diagram illustrating the frequency dependence of the Zout impedance of the circuit of FIG. 31.

FIG. 31 is a circuit diagram of the radio frequency circuit 3 in which the capacitor C3 and a resistor R3 are added within the third resonator 13. FIG. 32 is a characteristic diagram illustrating the frequency dependence of the Zbias impedance of the circuit of FIG. 31, and represents the simulation result.

The capacitance C of the capacitor C3 within the third resonator 13 is obtained by the following Equation (11).

$$C = \frac{1}{(2\pi f)^2 L} \tag{11}$$

In Equation (11), when the inductor L3=0.01 µH and f=18.4 MHz, the capacitance C of the capacitor C3 is 7.5 nF.

The resistor R3 within the third resonator 13 of FIG. 31 is provided for lowering Q, and is set to, for example, 0.5Ω. The resistor R3 may be omitted.

Figure 33:
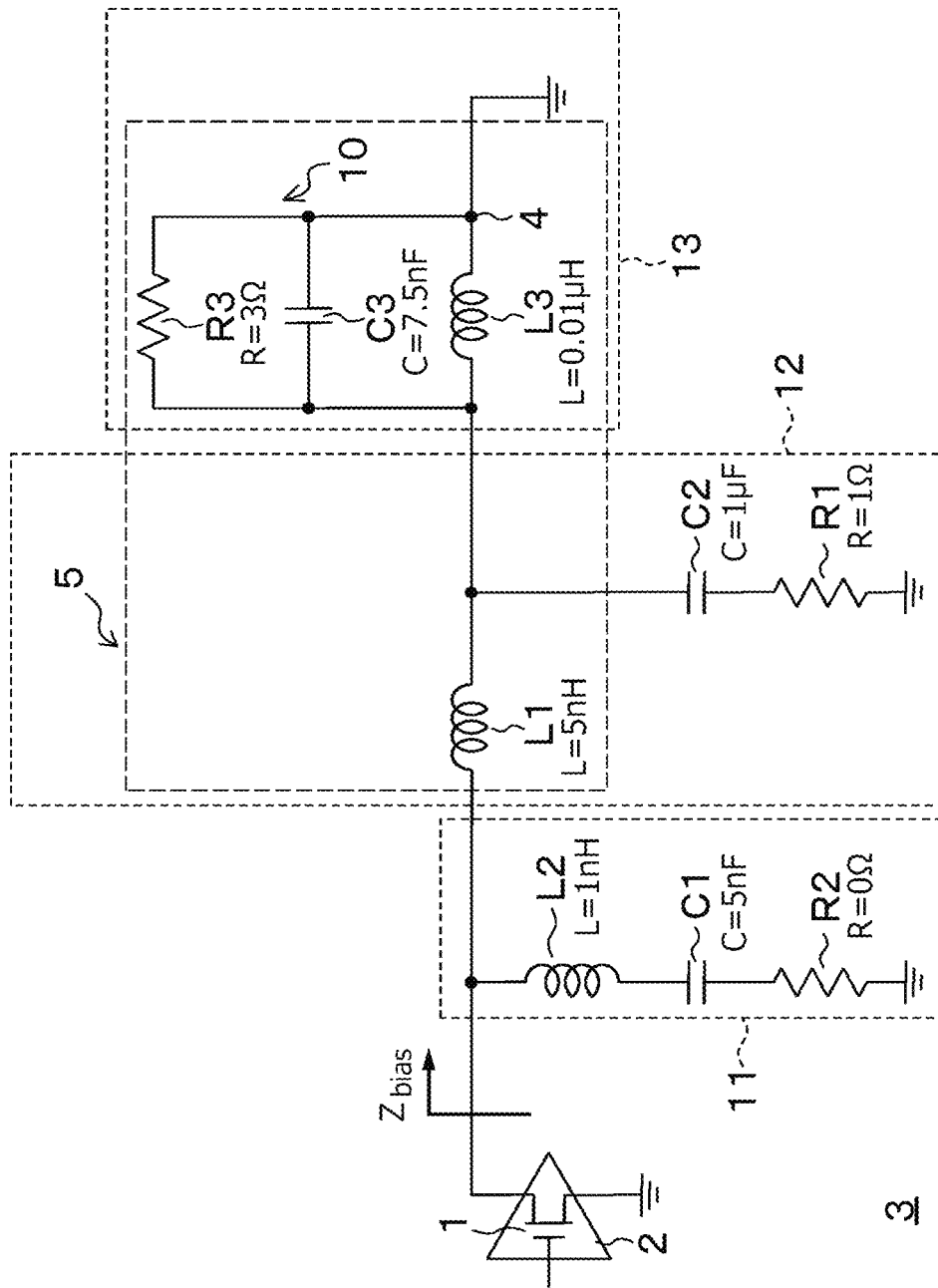
FIG. 33 is a circuit diagram in which the inductor, the capacitor, and the resistor within the third resonator are connected in parallel.
Figure 34:
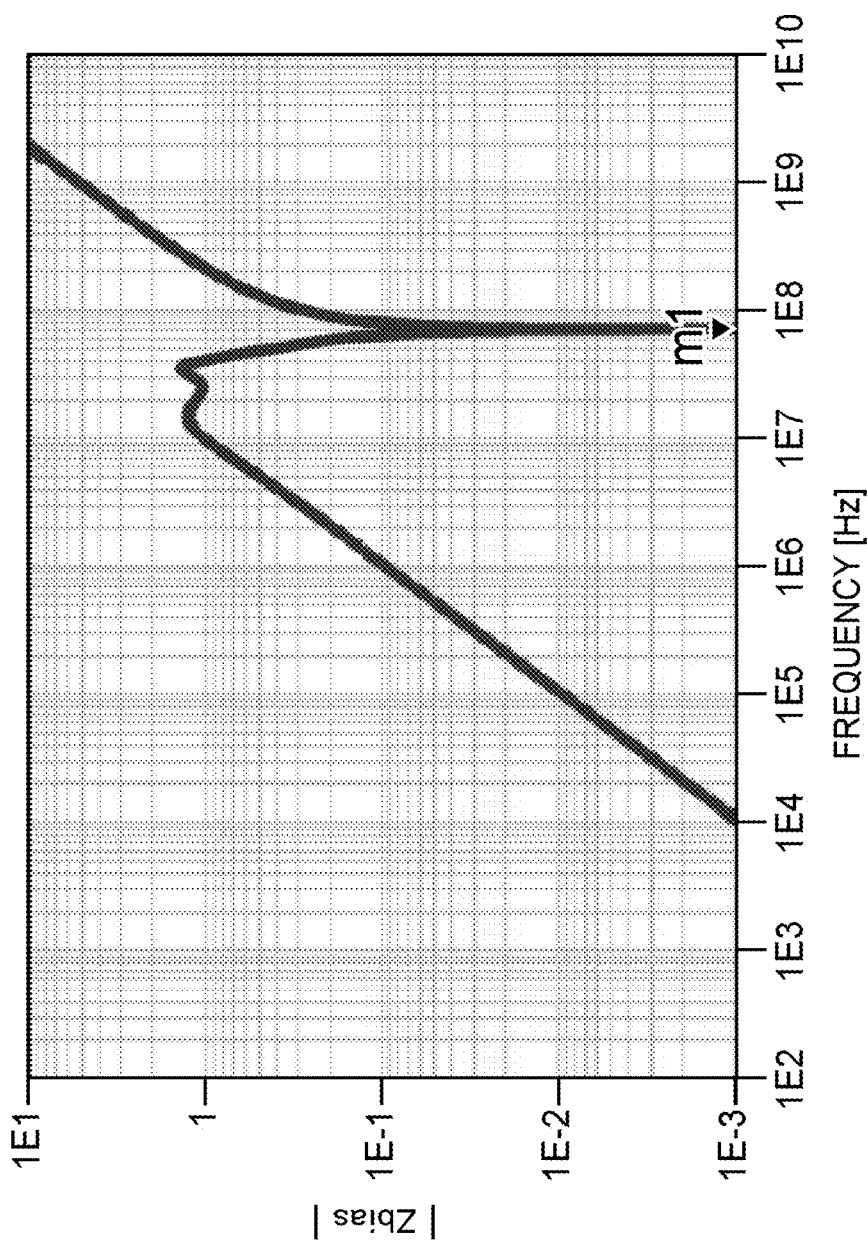
FIG. 34 is a characteristic diagram illustrating the frequency dependence of the Zbias impedance of the circuit of FIG. 33.

Although it has been described that the circuit in which the capacitor C3 and the resistor R3 within the third resonator 13 are connected in series is connected in parallel to the inductor L2 in the circuit of FIG. 31, the inductor L3, the capacitor C3, and the resistor R3 within the third resonator 13 may be connected in parallel as illustrated in FIG. 33. FIG. 34 is a characteristic diagram illustrating the frequency dependence of the Zbias impedance of the circuit of FIG. 33, and represents the simulation result. As can be seen from the comparison of the characteristics of FIG. 34 with the characteristics of FIG. 32, it is possible to obtain substantially the same impedance characteristics regardless of whether the resistor R3 is connected in series or in parallel with the capacitor C3. The inductor L3 may have a series resistor (hereinafter, referred to as R3' for the sake of convenience) in order to compensate for the attenuation of $X_0$. Although it has been described that R3 is provided in series with C3 in order to compensate for $X_0$ in FIG. 31 and R3 is provided in parallel with C3 in order to compensate for $X_0$ in FIG. 33, R3' may be provided in series with L3 within the third resonator 13, or R3' may be provided in series with the third resonator.

Since these circuit diagrams are baseband equivalent circuits, it is necessary to DC cut capacitor such that DC does not flow to GND through R3 when these circuits are actually used. Since R3 is connected in parallel with R1, R3 may be omitted, and R1 may be updated to the combined resistance value of R1 and R3. Although it has been described that the series connection of C3 and R3 is grounded and L3 is connected to the power supply node 4 in FIG. 31, these components can be regarded as being electrically connected in parallel in the baseband. Therefore, the series connection of C3 and R3 may be connected to the power supply node 4 instead of the ground.

The third resonator 13 can be replaced with a ferrite bead. Since the ferrite bead exhibits impedance similar to that of the parallel resonance circuit, the same impedance characteristic as that of FIG. 34 is obtained.

Figure 35B:
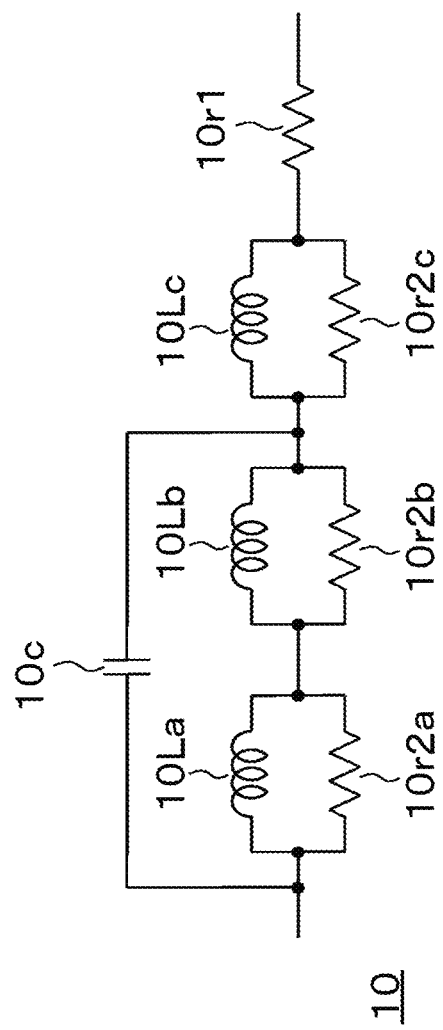
FIG. 35B is a complex equivalent circuit diagram of the ferrite bead.

FIG. 35A is a simple equivalent circuit diagram of a ferrite bead 10, and FIG. 35B is a complex equivalent circuit diagram of the ferrite bead 10. As illustrated in FIG. 35A, the ferrite bead 10 has a circuit configuration in which a resistor 10r1 is connected in series with a parallel resonance circuit in which an inductor 10L, a capacitor 10c, and a resistor 10r2 are connected in parallel. The ferrite bead 10 of FIG. 35B is configured such that a series connection circuit in which a plurality of parallel circuits each including an inductor 10La and a resistor 10r2a connected in parallel and an inductor 10Lb and a resistor 10r2b connected in parallel are connected in series and a parallel circuit of an inductor 10Lc and a resistor 10r2c and a resistor 10r1 are further connected in series with a circuit in which a capacitor 10c is connected to this series connection circuit including the inductors 10La and 10Lb and the resistors 10r2a and 10r2b in parallel. Since the ferrite bead 10 has impedance characteristics in which the impedance becomes maximum at the parallel resonance frequency, the ferrite bead can be applied to the circuit of FIG. 33.

An equivalent parallel resistor of the ferrite bead has a high value of several tens of Ω to several hundreds of Ω, the third resonator may not be completely replaced with the ferrite bead. The impedance may be adjusted by adjusting the value of the resistor R1 as necessary or inserting the inductor in series. Since the inductance value of the ferrite bead changes depending on the current (in generally, the inductance value of an inductor changes with current), it is possible to compensate for the inductance value by connecting the inductor in series. Since the ferrite bead and inductor have limitations of the current, they may be connected in parallel as necessary. Alternatively, a combination of the parallel connection and the series connection may be used if necessary.

Although it has been described that the inductors, the decoupling capacitors, and the resistors in the first resonator 11 and the second resonator 12 do not have parasitic components in the radio frequency circuit 3 illustrated in FIG. 31 and FIG. 33, since this parasitic component has an impedance less than a main impedance of a passive element, the parasitic component does not affect a circuit operation.

For example, the inductor has a parasitic resistor connected in series and a parasitic capacitance connected in parallel in one of the simplest equivalent circuit. The capacitor has a parasitic resistor and a parasitic capacitance connected in series in one of the simplest equivalent circuit. The resistor also has a parasitic inductor connected in series and a parasitic capacitance connected in parallel by a pad. The equivalent circuit of the inductor, the resistor, and the capacitor can be complicated in order to match measured data as necessary. For example, in the inductor, there are various complicated models as in FIG. 35B compared to the simple model of FIG. 35A. There is a ladder model as a complex equivalent circuit of the capacitor.

When the inductor is connected to the output node n1 of the amplifier 2, since the inductance of the inductor becomes an element that decides an upper limit frequency of the impedance of the radio frequency circuit 3, it is necessary to set the resonance frequency of the first resonator 11 in consideration of this impedance. That is, the inductor L1 within the first resonator 11 may be divided into a plurality of inductors. In this case, the inductor closer to the output node n1 of the amplifier 2 among the divided inductors may be included in the power supply path 5.

In summary, the basic configuration of the radio frequency circuit 3 according to the first embodiment is the configuration of the baseband equivalent circuit of FIG. 29. That is, the radio frequency circuit 3 according to the first embodiment includes the amplifier 2, the power supply path 5, the first resonator 11, and the second resonator 12. The third resonator 13 in which the resistor R3 is omitted from the circuit of FIG. 31 may be provided.

The amplifier 2 amplifies the input radio frequency signal. The power supply path 5 is disposed between the output node of the amplifier 2 and the power supply node 4 to which the DC bias voltage is supplied, and includes the first inductor L1 and the second inductor L3 connected in series.

The first resonator 11 is configured such that one end is connected between the output node of the amplifier 2 and the power supply path 5 and the other end is set to the reference potential, includes the third inductor L2 and the first capacitor C1 connected in series, and resonates at the series resonance frequency corresponding to the inductance of the third inductor L2 and the capacitance of the first capacitor C1. The third inductor L2 is divided into L2A and L2B in series, and L2A is inserted between the output node of the amplifier 2 and a node end of the first inductor L1 on a side of the amplifier 2, and the first resonator 11 below L2B may be a topology in which one end is connected to a connection node between the first inductors L1 and L2A and the other end is connected to the reference potential. That is, the first resonator 11 is configured such that a part of the third inductor L2 is inserted between the output node of the amplifier 2 and the power supply path 5 and includes another part of the third inductor L2 of which one end is connected between a part of the third inductor L2 and the power supply path 5 and the other end is set to the reference potential and the first capacitor C1 connected in series.

The second resonator 12 is configured such that one end is connected to the connection node between the first inductor L1 and the second inductor L3 and the other end is set to the reference potential, includes the second capacitor C2 and the first resistor R1 connected in series, and resonates at the series resonance frequency corresponding to the inductance of the first inductor L1, the capacitance of the second capacitor C2, and the resistance value of the first resistor R1.

The third resonator 13 includes the third capacitor C3 connected in parallel with the second inductor L3, and resonates at the parallel resonance frequency corresponding to the capacitance of the third capacitor C3 and the inductance of the second inductor L3.

The first resonator 11 includes the second resistor R2 connected in series with the third inductor L2 and the first capacitor C1, and resonates at the series resonance frequency corresponding to the inductance of the third inductor L2, the capacitance of the first capacitor C1, and the resistance value of the second resistor R2.

The peak of the anti-resonance due to the parallel resonance of the first inductor L1 and the first capacitor C1 can be controlled by the resistance values of the first resistor R1 and the second resistor R2.

The frequency of the anti-resonance may be a frequency less than the series resonance frequency of the first resonator 11.

The third resonator 13 may include the third resistor connected in series with the third capacitor C3 or connected in parallel with the second inductor L3 and the third capacitor C3.

The third resonator 13 may include the second inductor L3, the third capacitor C3, and the third resistor connected in parallel.

At least a part of the first inductor L1 may be a parasitic inductance of the power supply path 5, and at least a part of the first resistor R1 may be a parasitic resistor of the power supply path 5. At least a part of the first inductor L1 may be a parasitic inductance of the second capacitor C2, and at least a part of the first resistor R1 may be a parasitic resistor of the second capacitor C2. At least a part of the first inductor L1 may be a parasitic inductance of the first resistor. At least a part of the second inductor L3 may be a parasitic inductance of the power supply path 5, and at least a part of the resistor R3' may be a parasitic resistor of the power supply path 5. At least a part of the third inductor L2 may be a parasitic inductance of the power supply path 5, and at least a part of the second resistor R2 may be a parasitic resistor of the power supply path 5. At least a part of the third inductor L2 may be a parasitic inductance of the first capacitor C1, and at least a part of the second resistor R2 may be a parasitic resistor of the first capacitor C1. At least a part of the third inductor L2 may be a parasitic inductance of the second resistor R2.

At least a part of the third capacitor C3 may be a parasitic capacitance of the second inductor L3.

As stated above, the radio frequency circuit 3 according to the first embodiment connects the first resonator 11 between the output node n1 of the amplifier 2 and the power supply path 5, and includes the second resonator 12 including the first inductor L1 at the power supply path 5 and the third resonator 13 including the second inductor L3 connected in series with the first inductor L1 at the power supply path 5. Accordingly, the peak of the impedance due to the parallel resonance of the first capacitor C1 within the first resonator 11 and the first inductor L1 within the second resonator 12 and the parallel resonance of the second capacitor C2 and the second inductor L3 can be suppressed, and the impedance of the radio frequency circuit 3 can be reduced over the wideband of the baseband.

The radio frequency signal fed according to the first embodiment is branched between the middle of the first inductor L1 and the output node of the amplifier 2. Therefore, the third inductor L2 is selected so as to have the impedance greater than the impedance of the radio frequency signal in the carrier frequency band, and the radio frequency impedance is matched due to small capacitance such that the radio frequency signal has the lower impedance at the connection point of the third inductor L2. The radio frequency impedance of power supply path from the branch point to the power supply node side is selected high due to the inductance of the first inductor L1 between a radio frequency branch point and the connection point of the first inductor L1 and the second inductor L3. This inductance may be given by a transmission line, and the transmission line shorted in the carrier frequency at the connection point between L1 and L3 is desirable for achieving both high impedance in the radio frequency signal band and low impedance in the baseband. Since the high impedance close to open is obtained by setting a length of the transmission line to $\lambda/4$ of the radio frequency signal band, this length is also selected when the impedance matching of the radio frequency signal is not involved.

When the impedance matching is involved, a length other than $\lambda/4$ is selected. Although it has been described that since each circuit diagram of the first embodiment uses the baseband equivalent circuit, the bias power supply node 4 is grounded, a decoupling capacitor of the low impedance and a power supply circuit of the low impedance in the baseband band is connected between the power supply node 4 and the ground in the actual circuit. Although it has been described in the first embodiment that the first, second, and third resistors R1, R2, and R3 and the resistor R3' are appropriately used in order to give the loss to the circuit in the baseband bandwidth, the loss contributes to stabilization in the low frequency of the amplifier 2. Accordingly, the target impedance $X_0$ is decided in view of various circuit characteristics such as distortion, stabilization, gain, output power, and efficiency of the amplifier.

Second Embodiment

In a second embodiment, the impedance of the radio frequency circuit 3 is lowered by providing a resonator on an input side of the amplifier 2.

The radio frequency circuit 3 according to the second embodiment may include the circuit configuration of the radio frequency circuit 3 of FIG. 21, 23, 25, 27, 29, 31, or 33.

Figure 36:
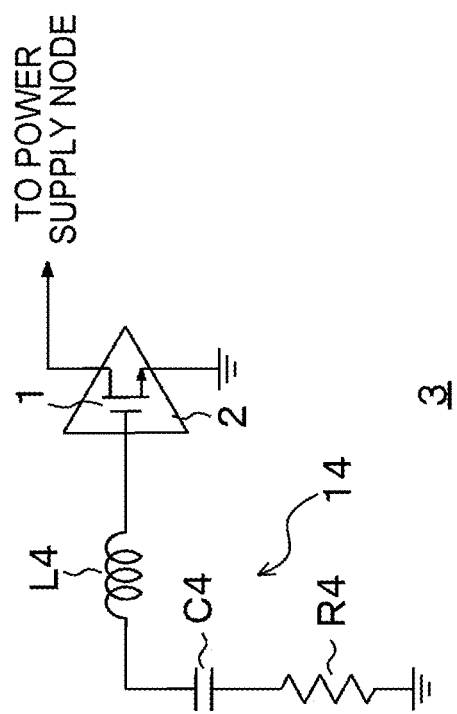
FIG. 36 is a circuit diagram on an input side of an amplifier of a radio frequency circuit according to a second embodiment.

FIG. 36 is a baseband equivalent circuit diagram on the input side of the amplifier 2 in the radio frequency circuit 3 according to the second embodiment. The radio frequency circuit 3 of FIG. 36 includes a fourth resonator 14. The fourth resonator 14 is connected between a gate (input node) of the transistor 1 within the amplifier 2 of FIG. 36 and a reference voltage node (for example, ground node). More specifically, the fourth resonator 14 is a series resonance circuit in which a fourth inductor L4, a fourth capacitor C4, and a fourth resistor R4 are connected in series. A series resonance frequency of the fourth resonator 14 is set according to a peak frequency of the baseband impedance on the output node side of the radio frequency circuit 3. For example, when the output side baseband impedance of the radio frequency circuit 3 has characteristics as illustrated in FIG. 32, since the impedance reaches a peak between 10 MHz and 30 MHz, element values of the fourth inductor L4, the fourth capacitor C4, and the fourth resistor R4 are set such that the fourth resonator 14 resonates in series at this frequency. The method of deciding the element values that satisfy the target impedance $X_0$ on the input side of the amplifier 2 is the same as that in the first embodiment, and the basic equation is $\sqrt{(L/C)}=R=X_0$, and a margin can be provided as necessary. It is possible to substantially suppress the peak of the impedance by setting $\sqrt{2}$ times $\sqrt{(L/C)}$ or R, as the margin. As mentioned above, the useful margin is 1 to 2.

Since the series resonance circuit has the impedance characteristics convex downward, the fourth resonator 14 resonates according to the frequency of the peak position of the baseband impedance on the output node side, and thus, it is possible to reduce the occurrence of the distortion at the peak position of the baseband impedance on the output node side.

A specific feed point of the radio frequency signal input to the radio frequency circuit 3 of FIG. 36 may be on a connection path between the gate (input node) and the fourth inductor L4, may be within the fourth inductor L4, or may be on a connection path between the fourth inductor L4 and the fourth capacitor C4. The order of the fourth inductor L4, the fourth capacitor C4, and the fourth resistor R4 constituting the fourth resonator 14 can be appropriately replaced. However, when these components are arranged in the order of FIG. 36, a DC bias can be supplied to the gate (input node) from the connection path between the fourth capacitor C4 and the fourth inductor L4. However, since the fourth capacitor C4 is present on the connection path between the fourth capacitor C4 and the fourth resistor R4, the bias cannot be supplied. The frequency characteristics as a stabilization resistor of the amplifier 2 change depending on the arrangement of the fourth resistor R4.

As described above, in the second embodiment, since the fourth resonator 14 as the series resonance circuit is provided on the input side of the amplifier 2 and the fourth resonator 14 resonates at the frequency of the peak position of the baseband impedance on the output node side of the radio frequency circuit 3, the occurrence of the distortion at the peak frequency of the baseband impedance on the output node side of the radio frequency circuit 3 can be reduced, and the distortion of the baseband can be reduced over the wideband. Accordingly, the distortion of the radio frequency signal is suppressed. In the second embodiment, the circuit illustrated in FIG. 21, 23, 25, 27, 29, 31, or 33 instead of the fourth resonator 14 may be used on the input side. In this case, the fourth resonator 14 is replaced with the first resonator 11.

Third Embodiment

In a third embodiment, an output voltage of the amplifier 2 is prevented from being introduced from a drain side (output) of the transistor 1 within the amplifier 2 to the gate (input node) side in a frequency region in which the baseband impedance on the output node side of the radio frequency circuit 3 is high.

The radio frequency circuit 3 according to the third embodiment may have the circuit configuration of the radio frequency circuit 3 of FIG. 21, 23, 25, 27, 29, 31, or 33. The radio frequency circuit 3 according to the third embodiment may include the fourth resonator 14 of FIG. 36.

Figure 37:
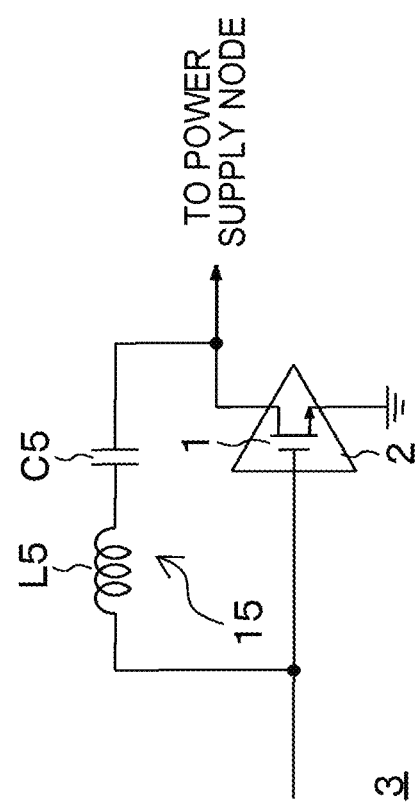
FIG. 37 is a circuit diagram around a transistor within an amplifier of a radio frequency circuit according to a third embodiment.

FIG. 37 is a circuit diagram around the transistor 1 within the amplifier 2 in the radio frequency circuit 3 according to the third embodiment. The circuit of FIG. 37 includes a fifth capacitor C5 and a fifth inductor L5 connected in series between a drain (output) and a gate (input) of the transistor 1. The fifth inductor L5 resonates in parallel with a gate-drain capacitance of the transistor 1, that is, a feedback capacitance. In the present specification, a parallel resonance circuit of the fifth inductor L5 and the feedback capacitance of the transistor 1 is referred to as a fifth resonator 15.

A baseband voltage of the output of the amplifier 2 is introduced from the drain (output) of the transistor 1 within the amplifier 2 to the gate (input) side at the peak frequency of the baseband impedance on the output node side of the radio frequency circuit 3, and thus, the distortion increases. The fourth resonator 14 according to the second embodiment performs an operation of short-circuiting the introduced distorted component to the ground node. In contrast, in the third embodiment, the distorted voltage component on the drain (output) side is prevented from being transmitted to the gate (input) side by isolating the gate (input) and the drain (output) of the transistor 1 from each other.

The fifth capacitor C5 in the circuit of FIG. 37 is a DC cut capacitor for cutting off a DC component. The fifth capacitor C5 has a large capacitance. When the fifth capacitor C5 is not attached, the drain (output) and the gate (input) of the transistor 1 are short-circuited by DC via the fifth inductor L5, and thus, the bias cannot be applied individually. In the present embodiment, the influence of the feedback capacitance of the transistor 1 is eliminated by providing the fifth inductor L5 that resonates in parallel with the feedback capacitance of the transistor 1, and the distortion of the amplifier 2 is reduced.

The fifth resonator 15 of FIG. 37 may include a resistor connected in series with the fifth inductor L5.

As stated above, in the third embodiment, since the fifth resonator 15 includes the fifth capacitor C5 that cuts off the DC voltage component introduced from the drain (output) of the transistor 1 to the gate side (input) and the fifth inductor L5 that resonates in parallel with the feedback capacitance of the transistor 1, it is possible to improve gain compression accompanying a decrease in bias voltage due to the distortion while suppressing the distortion of the output voltage of the amplifier 2.

Fourth Embodiment

Since there is a concern that the transistor 1 within the amplifier 2 forms an oscillation circuit together with the reactance elements therearound, it is necessary to perform measures to stabilize oscillation prevention. It is not desirable from the viewpoint of reduction in power efficiency that a loss for stabilizing the radio frequency band is given on the drain (output) side in an application where large power is extracted from the amplifier 2. Therefore, it is necessary to provide a resistor component that is insufficient to stabilize the radio frequency band on the gate (input) side of the transistor 1, and it is considered that the fourth resistor R4 within the fourth resonator 14 illustrated in FIG. 36 is used as the stabilization resistor.

Since the loss can be given on the output side outside the radio frequency band, the resistor R1 within the second resonator 12 illustrated in FIG. 31 may be used as the stabilization resistor for preventing oscillation. Alternatively, the ferrite bead 10 constituting the third resonator 13 of FIG. 33 may be used as the stabilization resistor. It is not desirable that the loss is given to the input side in order to stabilize the radio frequency band in an application where the amplifier 2 handles a small signal. Therefore, it is necessary to provide a resistor component that is insufficient to stabilize the radio frequency band on the drain (output) side of the transistor 1, and it is considered that the second resistor R2 within the first resonator 11 illustrated in FIG. 31 is used as the stabilization resistor.

As stated above, since the resistors within the first to fourth resonators 11 to 14 can be used as the stabilization resistors for preventing oscillation of the transistor 1, it is not necessary to separately connect the stabilization resistors. It is possible to provide a necessary loss in each frequency band in a well-balanced manner on the input side and the output side of the transistor by appropriately selecting the design values of the second to fourth resonators 11 to 14.

Fifth Embodiment

Figure 38:
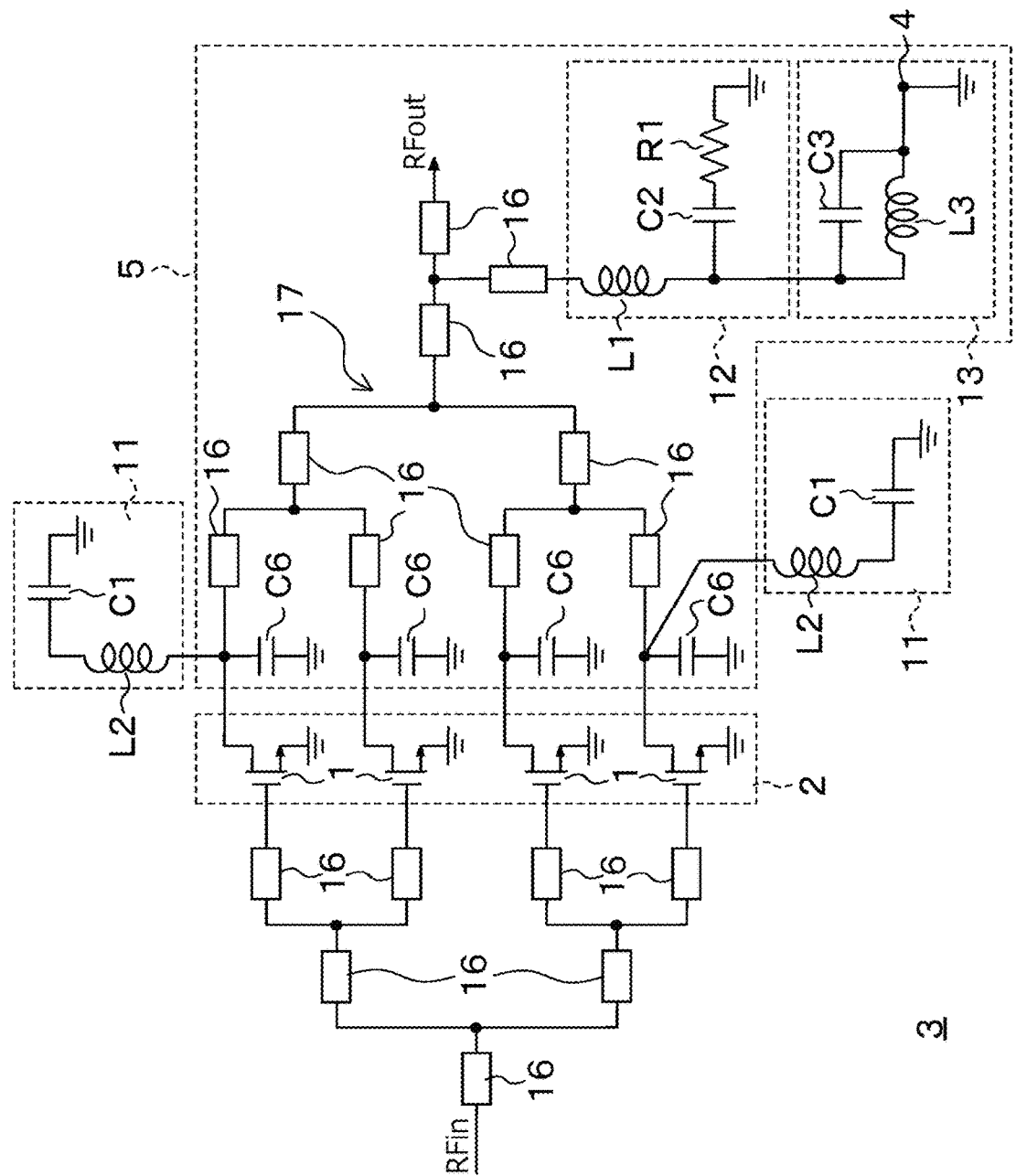
FIG. 38 is a circuit diagram of a radio frequency circuit according to a fifth embodiment.

FIG. 38 is a circuit diagram of the radio frequency circuit 3 according to a fifth embodiment. The amplifier 2 within the radio frequency circuit 3 of FIG. 38 includes a plurality of transistors 1. The gate (input) of each transistor 1 is connected to an input node RFin to which a radio frequency signal is input via a plurality of transmission lines 16.

The transmission line 16 is connected to the drain (output node n1) of each transistor 1. These transmission lines 16 are finally connected to RFout by being step-wisely integrated or combined. In the present specification, a transmission line group constituted by the plurality of lines 16 step-wisely combined is referred to as a combiner 17.

For example, the radio frequency circuit 3 of FIG. 38 is used to amplify an input signal having large power. In the radio frequency circuit 3 of FIG. 38, since the input signal is distributed to a plurality of branches and the signals amplified by the plurality of transistors 1 are combined by the combiner 17 and are output, it is possible to perform an amplification without exceeding a breakdown voltage of each transistor 1 even though the input signal having large power is input.

A capacitor C6 is connected in the vicinity of the drain of (output) each transistor 1. Each capacitor C6 is connected between the output node n1 of each transistor 1 and the reference potential node (for example, ground node). These capacitors C6 are matching capacitors. In the circuit of FIG. 38, the decoupling capacitors C1 are connected to the output node n1 of the top transistor 1 and the output node n1 of the bottom transistor 1, and the other capacitors C6 are the matching capacitors. A capacitance of the matching capacitor C6 is smaller than the capacitance of the decoupling capacitor C1. The drain of each transistor 1 usually has a drain-source capacitance. This drain-source capacitance is basically canceled, and is matched with a pure resistance load. Thus, for example, like this example an inductance is required from the output node n1 of the transistor 1 to the matching capacitor C6, and the drain-source capacitance, the inductance, and C6 constitute a π-matching network. Therefore, in this case, the first resonator 11 is connected to C1 via the inductor L2 having a high impedance in the carrier frequency band so as not to affect the matching, but the third inductor L2 and the first capacitor C1 can be actively used for matching. The gate of each transistor 1 usually has a gate-source capacitance. The gate-source capacitance is basically canceled, and is matched with a pure resistance load. The matching method is the same as that on the drain side. When the fourth resonator 14 is connected, the fourth inductor L4 is generally selected so that the fourth capacitor C4 does not adversely affect the impedance matching in the carrier frequency band. However, the fourth inductor L4, the fourth capacitor C4, and the fourth resistor R4 can be actively used for matching. Since a C-L-C π-matching network is equivalent to the transmission line 16, it is generally performed to match with a distributed constant circuit without assembling with a lumped constant circuit. In the present embodiment, the same effect can be obtained by any method.

Note that, among the output nodes n1 of the plurality of transistors 1, which output node n1 is connected to the decoupling capacitor C1 is arbitrary. The decoupling capacitor C1 is for decoupling in the baseband. Since the drain of each transistor 1 is connected through the line 16 and has a short electrical length in the baseband band, even though the decoupling capacitor of the first resonator 11 is connected to the output node n1 of any transistor 1, the same impedance reduction effect as that when the first resonator 11 is connected to the output node n1 of each transistor 1 can be obtained. When the plurality of resonators is connected, the effect of the parallel connection can be obtained.

In the circuit of FIG. 38, the second resonator 12 and the third resonator 13 described in the first to fourth embodiments are connected to an output node of the combiner 17. Accordingly, the second resonator 12 and the third resonator 13 can be shared by the plurality of transistors 1, and the overall circuit scale of the radio frequency circuit 3 can be reduced. Here, a part or all of L1 of the second resonator 12 can be replaced with the line 16. In general, since a λ/4 transmission line is used to branch from the signal line toward RFout such that the impedance when the second resonator 12 side is seen from the signal line is high, and a small capacitance or an open stub for short-circuiting a front end of the λ/4 transmission line at a high frequency is connected on the C2 side. The power supply stub does not necessarily need to have a high impedance, and can be actively used as a part of a matching element. Since each transistor 1 is connected via the line 16 that energizes DC, a common bias can be applied from the power supply node 4. When a plurality of second resonators 12 is connected, the inductance of L1 can be reduced by the parallel connection. Accordingly, a degree of freedom in setting the target impedance decided by a ratio of C1 and L1. When the plurality of second resonators 12 is connected, it is not necessary to connect the third resonators 13 to all the second resonators 12, and the parasitic second resonator 12 can be provided. Any number of fourth resonators 14 can be connected to the gate side of the transistor 1. Accordingly, the effect of further improving the distortion characteristics can be obtained. As in the case of the first resonator 11, since the electrical length of the distribution circuit using the line 16 on input side becomes short electrical length in the baseband, the fourth resonator 14 can be disposed at any position. The second resonator 12 and the third resonator 13 can be connected to the input side, and it is possible to achieve both stability and low-band impedance in the baseband. When the second resonator 12 is disposed on the gate (input) side, a resistor is inserted in series with L1 in many cases. This is because the resistor R1 is divided and arranged on the ground side and the power supply path side with respect to C2, and thus, frequency characteristics can be given to the circuit loss necessary for stabilization. As illustrated in FIG. 38, a technology for amplifying power with high efficiency or increasing linearity by intentionally giving a phase difference or a power difference to the radio frequency signal in the power amplification using the plurality of transistors 1 is known, and a push-pull amplifier, a Doherty amplifier, an outphasing amplifier can be used as the amplifier in FIG. 38. When a capacitor is inserted between the lines 16 to cut off DC and the second resonator 12 and the third resonator 13 are connected for each group, it is possible to give individual bias to each transistor. Although the parallel capacitor C3, the parasitic capacitance of L3 are given to the third resonator 13 in FIG. 38, the additional parallel capacitance is arbitrarily provided, and can be omitted when the target impedance in design is satisfied. An envelope tracking technology for modulating a drain bias voltage and a gate bias voltage in order to perform high-efficiency power amplification is known, and the achievement of the low impedance of the wide-band baseband provided in the present embodiment is required in a power supply modulation technology.

Sixth Embodiment

Figure 39:
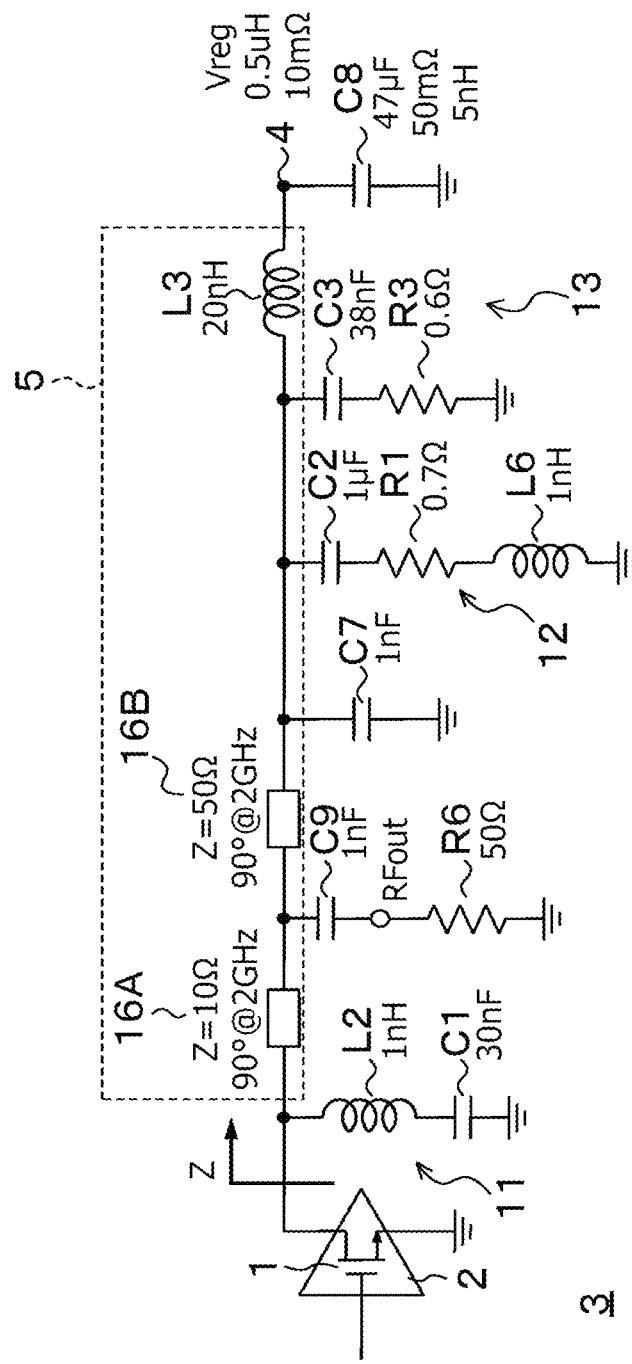
FIG. 39 is an equivalent circuit diagram of a radio frequency circuit according to a sixth embodiment.

In the first to fourth embodiments, since it is described that the baseband equivalent circuit is used, the feed path of the radio frequency (RF) signal output from the output node n1 of the amplifier 2 is not described in detail. However, since the feed path of the RF signal normally has an impedance of 50Ω, the circuit is represented by the equivalent circuit as illustrated in FIG. 39. In the equivalent circuit of FIG. 39, the inductor L2 of 1 nH and the capacitor C1 of 30 nF constitute the first resonator 11. In addition, a resistor R6 of 50Ω is provided between two λ/4 transmission lines 16A and 16B connected in series via a coupling capacitor C9 of 1 nF, and this path is a feed path of the RF signal, that is, a radio frequency output path. Parasitic inductance of the two λ/4 transmission lines 16A and 16B (equivalent to L1), a capacitor C7 of 1 nF, the capacitor C2 of 1 μF connected in series, the resistor R1 of 0.7Ω, and the inductor L6 of 1 nH constituted the second resonator 12. The capacitor C7 is provided in order to open the power supply side with respect to the RF signal. As stated above, the RF signal is branched from the second resonator 12 and is fed. The inductor L6 is a parasitic inductor of the capacitor C2 and the resistor R1. The λ/4 transmission line 16B and the capacitor C7 constitute a λ/4 length short stub. The capacitor C3 of 38 nF, the inductor L3 of 20 nH, and the R3 of 0.6Ω constitute the third resonator 13. A capacitor C8 of 47 μF is a decoupling capacitor connected to the power supply node 4. C8 has a parasitic equivalent series resistance of 50 mΩ and an equivalent series inductance of 5 nH. A power supply Vreg is connected to the power supply node 4. The power supply Vreg is given by an equivalent circuit of series connection of 0.5 uH and 10 mΩ. In the simulation, the voltage of Vreg is arbitrary. The characteristic impedance of the transmission line 16A is 10Ω and is a λ/4 transmission transformer that transforms the impedance of the radio frequency signal of 2 GHz into 50Ω to 2Ω of the RF feed path.

Figure 40:
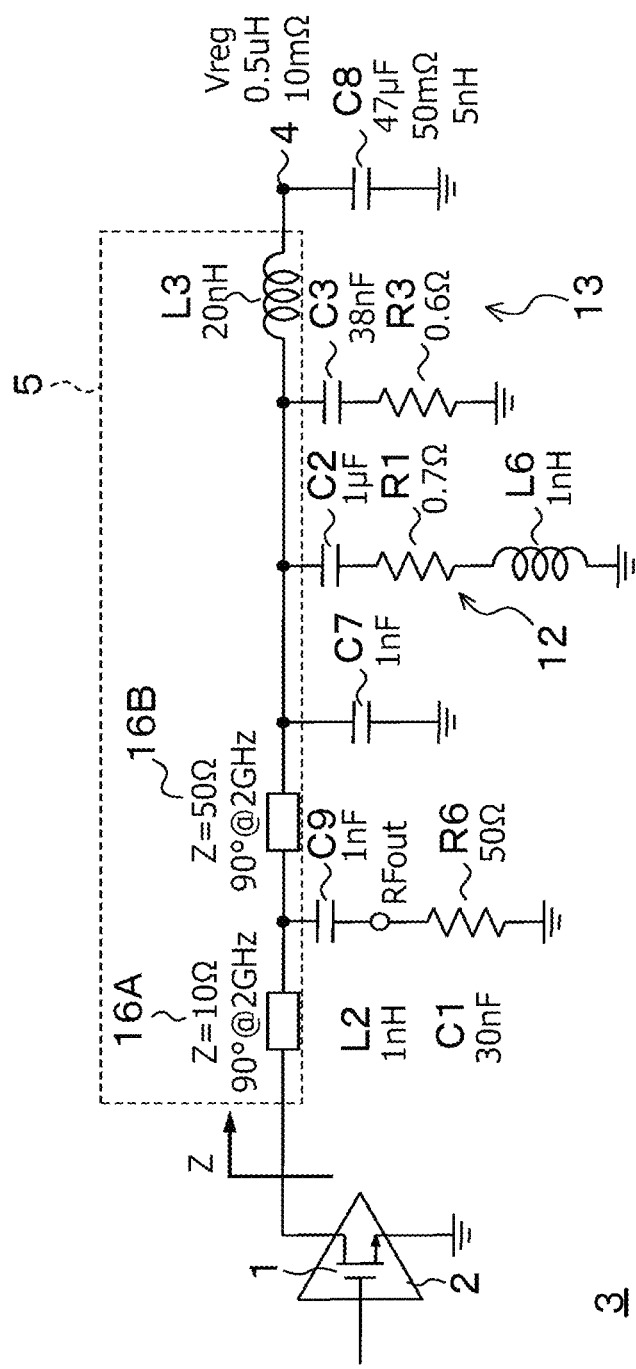
FIG. 40 is an equivalent circuit diagram of a comparative example.

FIG. 40 is an equivalent circuit according to a comparative example. The circuit of FIG. 40 is obtained by removing the first resonator 11 from the circuit of FIG. 39.

Figure 41:
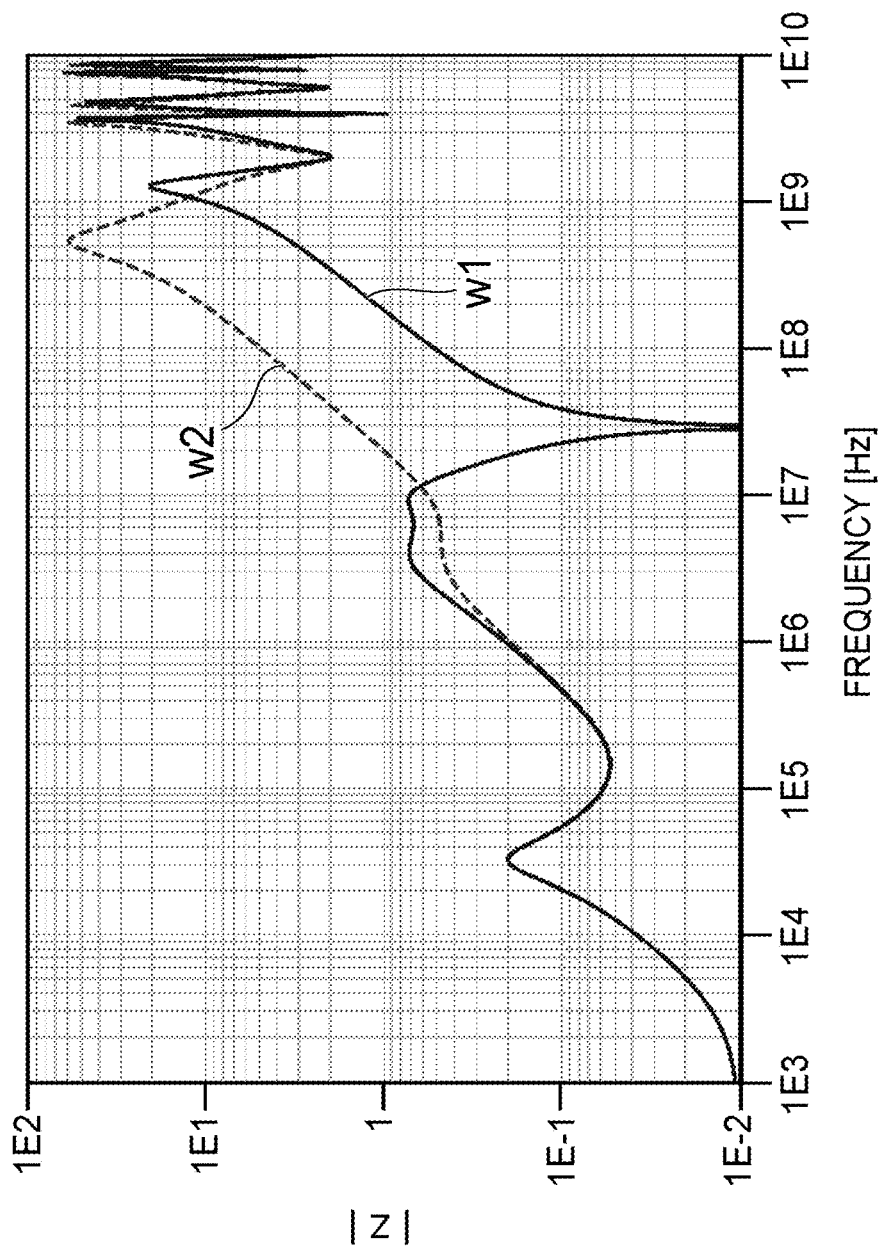
FIG. 41 is a characteristic diagram illustrating the frequency dependence of the impedances of the circuits of FIGS. 39 and 40.

FIG. 41 is a characteristic diagram illustrating the frequency dependence of the Zbias impedance of the circuits of FIGS. 39 and 40, and represents the simulation result. A characteristic w1 of FIG. 41 corresponds to the circuit in FIG. 39, and a characteristic w2 corresponds to the circuit of FIG. 40.

An impedance of 1Ω or less is maintained up to 200 MHz by connecting the first resonator 11. When there is no first resonator 11, a region of 1Ω or less is narrowed to 20 MHz. In this design example, the baseband impedance is specified to be 1Ω or less, but the impedance required to satisfy the distortion is different depending on the design of the amplifier 2. It is also possible to confirm that there is no change in the impedance of 2 GHz depending on whether or not there is the first resonator 11. In both w1 and w2, the impedance |Z| of 2 GHz is 2Ω, and matches the impedance converted by the transmission line 16A. In addition, a harmonic impedance such as a second harmonic impedance and a third harmonic impedance of 2 GHz also matches in w1 and w2. In this design, the first resonator 11 does not affect the harmonic impedance due to the effect of the inductor L2. When resonance characteristics for the radio frequency band are added to the first resonator 11, the radio frequency can be actively controlled.

Although the circuit on the drain side is described with reference to FIG. 39, the same applies to the branch of the RF input on the gate (input) side. As described in the fifth embodiment, the transistor 1 of the amplifier 2 generally has a drain-source capacitance and a gate-source capacitance, and the impedance is matched with the pure resistance by using the C-L-C π-type network such that these capacitances are basically canceled. In the present embodiment, it is assumed that impedance conversion is performed on the pure resistance of 2Ω within the amplifier 2. Therefore, the first resonator 11 is not directly connected to the drain of the transistor 1, but is connected via a series inductance.

It is possible to feed the RF signal such that the inductance between the first resonator 11 and the intrinsic drain is reduced as much as possible depending on the layout configuration of the transistor 1 within the amplifier 2, and it is possible to separately feed a path through which the radio frequency (RF) signal is matched and fed and a feed path for connecting the first resonator 11. In this case, the amplifier 2 has a plurality of output nodes. The same applies to the input side. A node for connecting the fourth resonator 14 or the first resonator 11 may be provided. A node for connecting the fifth resonator 15 may be provided.

The baseband impedance can be lowered over the wideband by providing the first resonator 11. The RF signal can be output without affecting the power supply by branching the RF signal from the second resonator 12.

Although it has been described in each of the aforementioned embodiments that the amplifier circuit of the general radio frequency band is used as an example, since each embodiment does not depend on the radio frequency bandwidth, a combination of a broadband technology for the radio frequency circuit and a narrow band technology for the radio frequency circuit may be used.

Although it has been described that the FET is used as the transistor of each embodiment, each embodiment does not depend on the kind of the transistor, the device structure, or the material. Therefore, FETs, bipolar transistors, elemental semiconductor devices, and compound semiconductor devices can be used.

Although it has been described in each embodiment that the common source (in the case of the bipolar transistor, a common emitter), each embodiment does not depend on the topologies. Therefore, the common gate (common base), and the common drain (common collector).

Each embodiment has been described by taking a single-ended transistor circuit as an example, but each embodiment does not depend on the circuit topologies of the amplification stage. Therefore, various forms such as cascode, Darlington configuration, negative feedback, push-pull, half bridge, and full bridge can be used.

Each embodiment has been described without limiting the operation class of the transistor, but each embodiment does not depend on the operation class of the transistor. Therefore, various operation modes such as Class A, Class AB, Class B, Class C, Class D, Class E, Class F, Class G, Class H, Class J, and Class S, or inverted Class D, inverted Class E, inverted Class F, and inverted Class 3 in which the current and voltage are replaced or there is a complex conjugate relationship can be used.

Although it has been described in each embodiment that the general amplifier 2 is used as an example, since each embodiment does not depend on an efficiency improvement technology of the amplifier 2, a combination of a power supply modulation technology such as envelope tracking or EER, and a load modulation technology such as outphasing, LINC, Doherty, inverse Doherty, a sequential amplifier, or dynamic load line modulation may be used.

In each embodiment, a part or all of the circuit elements can be replaced with variable elements. Each embodiment has the wideband, but it is possible to further widen the band width and improve performance by using the variable elements.

The amplifier 2 of each embodiment (Example of common source) can be combined with gate modulation (base modulation) or drain modulation (collector modulation). In particular, this amplifier can perform linear power control in the drain modulation, and is appropriate for amplification of a modulation with variable amplitude signal.

Although it has been described in each embodiment that a general amplification stage, particularly, a power amplifier is used as an example, each embodiment does not depend on the application of the amplifier 2. Therefore, the present invention can be used for a voltage amplifier, a current amplifier, a transimpedance amplifier, and a transconductance amplifier. For example, amplification accompanied by frequency conversion, a frequency converter, a mixer, an up converter, a down converter, a multiplier such as a doubler or a tripler, a frequency divider can be used. The present invention can be used for an oscillator using the amplifier 2. In particular, the present invention can be appropriate for an oscillator with modulation and an oscillator with variable frequency.

As in the general amplifier, each embodiment can improve linearity by combining with distortion compensation technologies such as predistortion, feedforward, and feedback. In particular, since the baseband impedance is reduced to the wideband, suppression of a memory effect can be expected, but a further improvement can be expected by combining with a distortion compensation technology such as digital predistortion (DPD) having a memory effect suppression function.

Each embodiment uses a low-pass type circuit topology in the DC supply path between the amplifier 2 and a DC bias terminal, but a high-pass type circuit can be used in a region in which DC is cut by a capacitor in the RF path and the bias path. Therefore, it is possible to use a combination of technologies such as a Foster circuit, a non-Foster circuit, a right-handed system, a left-handed system, EBG, and meta-material for each of these regions.

The application of the radio frequency circuit according to each embodiment is not limited to a specific application, and can be widely applied. For example, the radio frequency circuit is used in generally communication, broadcast, radar, imaging, and radio wave application devices such as mobile phone terminals, mobile phone base stations, mobile phone repeaters, wireless LAN access points, wireless LAN stations, wireless access base stations, repeaters, and terminals such as WiMAX, terrestrial digital broadcast transmitters, terrestrial digital broadcast repeaters, AM broadcast transmitter, fixed microwave communication devices, STL/TTL systems, FPU system, wireless systems for non-public purposes such as police, railway, fire, disaster prevention, ship, coastal, aeronautical, aircraft control, taxi, bus, transport, power, water, gas company, mass media, third party radio system (trunked radio system), telemeter, telecontrol, object identification, and military, satellite communication systems such as VSAT, road-to-vehicle communication such as ETC and DSRC, inter-vehicle communication, automotive radar, road-side radar such as vehicle speed and traffic measurement and foreign object detection, airport radar such as surveillance radar (ASR, PSR, SSR), ASDE (Airport Surface Detection Equipment), and PAR (Precision Approach Radar), weather radar, imaging, beacon, power transmission, induction heating, radio frequency heating, sputtering devices, semiconductor processing devices, plasma generators, accelerators, radio frequency power supplies for medical and measurement.

Each embodiment does not depend on the implementation method and structure. Even though the radio frequency circuit is monolithically manufactured on an MMIC, is manufactured as a hybrid of a circuit on a ceramic substrate or a resin substrate and a semiconductor substrate, is manufactured within a semiconductor package, is manufactured as a radio frequency module, is manufactured as a substrate built-in circuit, or is manufactured on a flexible substrate, effects can be obtained as long as the circuit configurations illustrated in the embodiments can be realized. Various deformations such as a case where a part of the power supply path becomes wire bonding, feedthrough, a feedthrough capacitor, bump or solder ball connection depending on the implementation are considered, but since such implementations are implementation forms assumed in the normal radio frequency circuit, it is possible to obtain the effects of the aforementioned embodiments.

Although several embodiments of the present invention have been described, these embodiments are presented by way of example, and are not intended to limit the scope of the invention. These novel embodiments can be implemented in various other forms, and various omissions, replacements, and changes can be made without departing from the gist of the invention. These embodiments and modifications thereof are included in the scope and gist of the invention, and are included in the invention described in the claims and the equivalents thereof.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. An electronic circuit comprising:
   an amplifier that amplifies an input radio frequency signal;
   a power supply path that is disposed between an output node of the amplifier and a power supply node to which a DC bias voltage is supplied, and includes a first inductor and a second inductor connected in series;
   a first resonator that comprises a third inductor and a first capacitor connected in series to the third inductor, at least a part of the third inductor being connected between the output node of the amplifier and the power supply path, and has a series resonance frequency corresponding to an inductance of the third inductor and a capacitance of the first capacitor;
   a second resonator that comprises a second capacitor connected to a connection node between the first inductor and the second inductor, and a first resistor connected in series to the second capacitor, and that has a series resonance frequency corresponding to an inductance of the first inductor, and a capacitance of the second capacitor; and
   a third resonator that comprises a third capacitor connected in parallel with the second inductor, and has a parallel resonance frequency corresponding to a capacitance of the third capacitor and an inductance of the second inductor.

2. The electronic circuit according to claim 1,
   wherein the first resonator comprises a second resistor connected in series with the third inductor and the first capacitor, and resonates at a frequency corresponding to an inductance of the third inductor, a capacitance of the first capacitor, and a resistance value of the second resistor.

3. The electronic circuit according to claim 2,
   wherein a peak of an impedance due to parallel resonance of the first inductor and the first capacitor is controlled by resistance values of the first resistor and the second resistor.

4. The electronic circuit according to claim 3,
   wherein a frequency of the peak is a frequency lower than the series resonance frequency of the first resonator.

5. The electronic circuit according to claim 1,
   wherein the third resonator comprises a third resistor including at least one of a resistor connected in series with the third capacitor, a resistor connected in parallel with the second inductor and the third capacitor, and a resistor connected in series with the third resonator.

6. The electronic circuit according to claim 5,
   wherein the third resonator comprises a ferrite bead including the second inductor, the third capacitor, and at least a part of the third resistor connected in parallel.

7. The electronic circuit according to claim 1,
   wherein at least a part of the first inductor is a parasitic inductance of the power supply path, and
   at least a part of the first resistor is a parasitic resistance of the power supply path.

8. The electronic circuit according tip claim 1,
   wherein at least a part of the third capacitor is a parasitic capacitance of the second inductor.

9. The electronic circuit according to claim 1, further comprising:
   a fourth resonator that comprises a fourth inductor, a fourth capacitor, and a fourth resistor connected in series to an input node of the amplifier to which the radio frequency signal is input, and resonates at a frequency corresponding to an inductance of the fourth inductor, a capacitance of the fourth capacitor, and a resistance value of the fourth resistor.

10. The electronic circuit according to claim 1, further comprising:
    a fifth inductor and a fifth capacitor connected in series between an input node of the amplifier to which the radio frequency signal is input and the output node, and
    wherein the fifth inductor and a feedback capacitance of the amplifier resonate in parallel.

11. The electronic circuit according to claim 1, wherein the amplifier comprises a plurality of amplifier circuitries;
    the amplifier circuitries comprise a first amplifier that amplifies a first radio frequency signal input and a second amplifier that amplifies a second radio frequency signal input; and
    the first resonator is connected between a first output node of the first amplifier and the power supply path,
    the electronic circuit further comprises a combiner that combines the amplified first radio frequency signal and second radio frequency signal, the combiner being disposed between a first output node, a second output ode of the second amplifier and the power supply node,
    wherein the second resonator and the third resonator are connected to the combiner.

12. The electronic circuit according to claim 1,
    wherein the first inductor of the second resonator comprises two inductor units connected in series, and
    a radio frequency output path that outputs the radio frequency signal output from the output node of the amplifier is connected to a connection node between the two inductor units.

13. The electronic circuit according to claim 1,
    wherein the first inductor and the third inductor comprises a part or a whole of a matching circuitry the radio frequency signal.

14. The electronic circuit according to claim 11,
    wherein the first inductor and the third inductor comprises a part or a whole of the combiner.

15. The electronic circuit according to claim 12,
    wherein the first inductor and the third inductor comprises a part or a whole of the radio frequency output path.

16. The electronic circuit according to claim 1,
    wherein the third inductor is connected between the output node of the amplifier and the power supply path, or a part of the third inductor is inserted between the output node of the amplifier and the power supply path and another part of the third inductor is connected between the output node of the amplifier and the power supply path.

* * * * *